(12) United States Patent
Boggs

(10) Patent No.: US 7,725,434 B2
(45) Date of Patent: May 25, 2010

(54) METHODS, SYSTEMS, AND COMPUTER PROGRAM PRODUCTS FOR AUTOMATIC CREATION OF DATA TABLES AND ELEMENTS

(75) Inventor: Ronald Boggs, Alpharetta, GA (US)

(73) Assignee: AT&T Intellectual Property, I, L.P., Reno, NV (US)

( * ) Notice: Subject to any disclaimer, the term of this patent is extended or adjusted under 35 U.S.C. 154(b) by 1051 days.

(21) Appl. No.: 11/382,365

(22) Filed: May 9, 2006

(65) Prior Publication Data

US 2007/0036076 A1 Feb. 15, 2007

Related U.S. Application Data

(63) Continuation-in-part of application No. 10/825,506, filed on Apr. 15, 2004, now abandoned.

(51) Int. Cl.
*G06F 17/30* (2006.01)

(52) U.S. Cl. .......... 707/613; 707/636; 707/640; 707/661; 707/687; 707/791

(58) Field of Classification Search ......... 707/600–831
See application file for complete search history.

(56) References Cited

U.S. PATENT DOCUMENTS

| | | | |
|---|---|---|---|
| 4,456,788 A | 6/1984 | Kline et al. | |
| 5,333,183 A | 7/1994 | Herbert | |
| 5,359,649 A | 10/1994 | Rosu et al. | |
| 5,410,589 A | 4/1995 | Galligan | |
| 5,675,582 A | 10/1997 | Hummel et al. | |
| 6,011,838 A | 1/2000 | Cox | |
| 6,449,350 B1 | 9/2002 | Cox | |
| 6,611,872 B1 | 8/2003 | McCanne | |
| 7,095,759 B1 | 8/2006 | Fitzgerald | |
| 7,379,912 B1 | 5/2008 | Camin et al. | |
| 2002/0083067 A1* | 6/2002 | Tamayo et al. | ............ 707/100 |
| 2002/0093947 A1 | 7/2002 | Allen, Jr. et al. | |
| 2002/0138563 A1 | 9/2002 | Trivedi | |

OTHER PUBLICATIONS

S. Chaudhuri, U. Dayal; An Overview of Data Warehousing and OLAP Technology; based on conference in 1996; pp. 1-10.
S. Chaudhuri, U. Dayal; Data Warehousing and OLAP for Decision Support; Copyright 1997; pp. 507-508.
What is an Erlang; [online]; [retrieved on Aug. 7, 2007]; retrieved from the Internet http://www.erlang.com/whatis.html.

* cited by examiner

*Primary Examiner*—Isaac M Woo
(74) *Attorney, Agent, or Firm*—Cantor Colburn LLP

(57) ABSTRACT

A method for implementing standardized enterprise warehouse system processes, including: extracting content from one or more source systems that provide a feed for the content; loading extracted content into one or more standardized data layout tables of a data control structure based upon meta-data and rules that define the data control structure, wherein the extracted content is in condition for transformation and data warehouse loading, and the standardized data layout tables comprise a logical data model; propagating the extracted content into a physical data model, and updating the physical data model upon the detection of a data event.

20 Claims, 15 Drawing Sheets

HOURLY DATA

| GLOBAL TRUNK GROUP ID | | BUSY HR TIME | 10:30 | | CLO | | ADDS | | | |
| --- | --- | --- | --- | --- | --- | --- | --- | --- | --- | --- |
| | | BUSY HR LOAD | 3354 | | DUE DATE | | PENDING DISC | | | |

TRUNKS IN SVC (TIS) SW N/A  TIRKS 408

VIEW ● TODAY  ○ HISTORY

START DATE / END
START TIME / END

OFFICE A ID – LOCAL OFFICE A TRUNK GROUP ID

| DATE | TIME | PC IN | PC OUT | OVFL | % OVFL | HOLD T | USAGE | MAINT | NMB |
| --- | --- | --- | --- | --- | --- | --- | --- | --- | --- |
| 1/1/04 | 12:00 | 382 | 984 | 0 | 0 | 209 | 2860 | 0 | 0 |
| 1/1/04 | 11:30 | 401 | 1056 | 0 | 0 | 212 | 3084 | 0 | 0 |
| 1/1/04 | 11:00 | 413 | 1076 | 0 | 0 | 226 | 3368 | 0 | 0 |
| 1/1/04 | 10:30 | 419 | 1145 | 0 | 0 | 234 | 3652 | 0 | 0 |
| 1/1/04 | 10:00 | 0 | 0 | 0 | 0 | 0 | 0 | 0 | 0 |
| 1/1/04 | 09:30 | 0 | 0 | 0 | 0 | 0 | 0 | 0 | 0 |

OFFICE Z ID – LOCAL OFFICE Z TRUNK GROUP ID

| DATE | TIME | PC IN | PC OUT | OVFL | % OVFL | HOLD T | USAGE | MAINT | NMB |
| --- | --- | --- | --- | --- | --- | --- | --- | --- | --- |
| 1/1/04 | 12:00 | 984 | 382 | 0 | 0 | 209 | 2860 | 0 | 0 |
| 1/1/04 | 11:30 | 1056 | 401 | 0 | 0 | 212 | 3084 | 0 | 0 |
| 1/1/04 | 11:00 | 1076 | 413 | 0 | 0 | 226 | 3368 | 0 | 0 |
| 1/1/04 | 10:30 | 1145 | 419 | 0 | 0 | 234 | 3652 | 0 | 0 |
| 1/1/04 | 10:00 | 0 | 0 | 0 | 0 | 0 | 0 | 0 | 0 |
| 1/1/04 | 09:30 | 0 | 0 | 0 | 0 | 0 | 0 | 0 | 0 |

SHOW OFFICE FLAG    SHOW CLUSTER DATA    GRAPH    EXPORT

METHODS, SYSTEMS, AND COMPUTER PROGRAM PRODUCTS FOR AUTOMATIC CREATION OF DATA TABLES AND ELEMENTS

CROSS REFERENCE TO RELATED APPLICATIONS

This application is a continuation-in-part of U.S. application Ser. No. 10/825,506, filed Apr. 15, 2004, which claims the benefit of U.S. Provisional Application Ser. No. 60/462,991, filed Apr. 15, 2003, both of which are incorporated herein by reference in their entireties. This application is also related to a commonly assigned U.S. patent application Ser. No. 11/382,370, entitled "METHODS, SYSTEMS, AND COMPUTER PROGRAM PRODUCTS FOR IMPLEMENTING DATA STANDARDIZATION ACTIVITIES", filed on May 9, 2006, a commonly assigned U.S. patent application Ser. No. 11/382,374, entitled "METHODS, SYSTEMS, AND COMPUTER PROGRAM PRODUCTS FOR IMPLEMENTING DATA TRANSFORMATION PROCESSES", filed on May 9, 2006, a commonly assigned U.S. patent application Ser. No. 11/382,377, entitled "METHODS, SYSTEMS, AND COMPUTER PROGRAM PRODUCTS FOR IMPLEMENTING A STANDARDIZED INTERPRETIVE ENGINE", filed on May 9, 2006, a commonly assigned U.S. patent application Ser. No. 11/382,361, entitled "METHODS, SYSTEMS, AND COMPUTER PROGRAM PRODUCTS FOR IMPLEMENTING LOGICAL AND PHYSICAL DATA MODELS", filed on May 9, 2006, and a commonly assigned U.S. patent application Ser. No. 11/382,368, entitled "METHODS, SYSTEMS, AND COMPUTER PROGRAM PRODUCTS FOR DATA PROCESSING CONTROL", filed on May 9, 2006, all of which are incorporated herein by reference in their entireties.

BACKGROUND

The present invention relates generally to data processing systems, and more particularly, to a method, system, and computer program product for implementing standardized enterprise warehouse system processes in a telecommunications environment.

As known in the art, trunks and trunk groups are used to connect telephone company central offices (COs). Historically, analog frequency-division multiplexed (FDM) trunks were replaced in the 1960s and 1970s with digital time-division multiplexed (TDM) trunks using T-carrier and E-carrier technologies of various capacities such as the twenty-four 56/64 kbps digital speed 0 (DS0) channels in a T1 or the thirty-two DS0 channels in an E1. Today, the Plesiochronous Digital Hierarchy (PDH) of T-carrier and E-carrier for trunks usually has been replaced by the Synchronous Digital Hierarchy (SDH) as implemented in SONET (Synchronous Optical Network) rings on optical fiber carriers (OC). Unlike the higher T-carrier multiplexing levels such as T3, which carries 28 DS1s with 24 DS0s each for a total of 28×24=672 DS0s, the SDH technologies such as OC-1 carry the DS0s in a floating frame to allow easier dropping and insertion of DS0 channels despite slight timing differences of the network multiplexers.

While optical fiber technology as well as wavelength division multiplexing (WDM), which essentially frequency-division multiplexes multiple optical signals on a single fiber, has increased the bandwidth available relative to the costs of implementing, installing, and supporting a given bandwidth, capacity planning and management for large scale networks still can be valuable in the efficient economic use of telecommunication network assets and facilities. Generally, the public switched telephone network (PSTN) was developed to handle circuit-switched voice telephone calls. Local loops or access lines provide analog plain old telephone service (POTS) to residences and business. Generally, the loops or subscriber lines are connected to switches or to multiplexers known as subscriber loop carrier (SLC) systems, digital loop carrier (DLC) systems, or remote terminals that generally concentrate the traffic of multiple access lines into a multiplexed line that connects to a switch.

To establish connections through the telecommunications network, customers usually enter a destination address commonly known as a phone number that generally is interpreted by the originating switch to which the customer's access line is connected. In modem networks, the originating switch usually communicates Signaling System 7 (SS7) messages to various databases and other switches to establish a connection through the network from the calling address (essentially the phone number of the call originator) to the called address (essentially the destination phone number). The switches and SS7 databases establish a route for the call over the trunks between switches using network elements such as, but not limited to, transmission facilities, multiplexers, and possibly intermediate switches.

While the PSTN was initially designed to handle voice telephone calls, the network now is used for many other types of communications. Some of the traffic engineering concepts developed for circuit-switched voice telephone call capacity planning also are relevant for properly designing and sizing the more complex network of today. In particular, the load or utilization level of connection-oriented systems that use fixed quantities of bandwidth (or multiples of a base fixed quantity of bandwidth) for each connection can be measured by multiplying the time for each connection by the number of base bandwidth units utilized in the connection. For instance, an Integrated Services Digital Network (ISDN) Basic Rate Interface (BRI) connection using two 64 Kbps DS0 B-channels to an Internet Service Provider (ISP) for one minute represents 2 DS0 channels×60 seconds or 120 connection-seconds or call-seconds, when the base unit of bandwidth for a call is one DS0 channel. The connection-seconds or call-seconds unit of network load usage/utilization (as well as network load capacity) is a useful metric or measurement that has been used in telephone network traffic engineering when the network was all analog with analog switches and trunks, and that is still used today when the switches and trunks primarily are based on establishing digital connections at multiples of the DS0 56/64 kbps bit rate.

Although the PSTN generally standardized 3.1 KHz connections through analog switches and over analog trunks as well as 56/64 kbps ITU-T G.711 µ-law or A-law pulse code modulation (PCM) connections through digital switches and over digital trunks to handle voice telephone calls, the call-seconds metric can be used as a measurement for DS0-based data communications as well. In addition, other base bandwidth units than a DS0 or a 3.1 KHz audio channel may be used as well with the call-seconds metric. For instance, modem voice encoding algorithms such as ITU-T G.726 adaptive differential pulse code modulation (ADPCM) and ITU-T G.729 code excited linear prediction (CELP) support 32 kbps and 8 kbps voice encoding respectively. The bandwidth of a single 64 kbps channel could be managed at a level that allows 2×32 kbps ADPCM calls or 8×8 kbps CELP calls over a single DS0. For 32 kbps ADPCM calls, the 64 kbps DS0 has a capacity of 2 calls×3,600 seconds/hour=7,200 ADPCM call-seconds/hour. For 8 kbps CELP calls, the 64 kbps DS0 has a capacity of 8 calls×3,600 seconds/hour=28,800 CELP call-seconds/hour. Furthermore, the call-seconds or connection-seconds metric may be relevant for other connection-oriented communications (such as, but not limited to, the logical channels of X25 or the virtual circuits of frame relay and asynchronous transfer mode (ATM)) that are utilized in constant bit rate (CBR) applications that happen to communicate at some multiple of a base bit-rate. Other load metrics or measurements than call-seconds likely would be used for measuring connectionless communications or connection-oriented communications in which the bandwidth utilized for each connection generally is completely variable. Thus, although the call-second metric normally is applied to circuit-switched calls through the PSTN, the metric is useful for other types of communications as well.

Several queuing theory performance models were developed by Danish mathematician A. K. Erlang, and are used in telecommunications network traffic engineering. Also, instead of using call-seconds as the units for work load, one skilled in the art often may use units of hundreds of call-seconds or centum call-seconds (CCS), or even the unit of Erlangs to ease the representation of workload numbers. As one skilled in the art will be aware, a centum call-second (CCS) is 1 call or connection occupying a channel (or server) for 100 seconds. In addition, one skilled in the art will be aware that an Erlang is one call or connection occupying a channel (or server) for one hour or 1 Erlang=36 CCS.

In the past, network traffic engineers have collected data on trunk group utilization and load levels to plan future network capital improvements and efficiently deploy networking equipment to meet the desired service level requirements. Often this utilization and load information was collected from network switches and other active network elements to generate reports that network engineers would manually sift through to help in planning future changes and reconfigurations of the network. The large volume of performance data generated by the network monitoring together with complexities of the computations often led to an estimation of network load based on a determination of a busy hour statistic, which generally was calculated with a frequency of about once per year. Network planning and forecasting based on such a yearly busy hour determination likely would diverge significantly from actual network usage and utilization over the course of a year in today's dynamically changing telecommunications environment. Thus, a system that automates many of these network monitoring, performance analysis, and capacity planning/forecasting tasks could improve economic efficiency by more accurately matching network equipment deployments to meet the service level requirements at a particular network load level. Such a system would reduce the underutilized network assets that are deployed, while increasing the deployment of network assets in areas where the service level goals are not being met or are just marginally being met.

Currently available complex systems that are capable of performing the types of functions described above often use both logical and physical data models to manage the network traffic information received. The logical and physical data models are databases used by the system to organize and save the network information received. When changes, such as the addition or removal or network elements, are made to the network a database administrator must manually update both the logical and physical data models to reflect the changes in the network.

U.S. Pat. No. 6,011,838 entitled "Process and System for Dynamically Measuring Switch Traffic" and issued to Stephen Todd Cox on Jan. 4, 2000 as well as U.S. Pat. No. 6,449,350 entitled "Processes and Systems for Dynamically Measuring Switch Traffic" and issued to Stephen Todd Cox on Sep. 10, 2002 describe some of the traffic engineering concepts related to switch elements and modules. U.S. Pat. No. 6,011,838 and U.S. Pat. No. 6,449,350 are each incorporated by reference in their entireties herein. However, neither of these two patents addresses the traffic engineering issues for trunking and trunk groups.

Thus, a heretofore unaddressed need exists in the industry to address the aforementioned deficiencies and inadequacies.

BRIEF SUMMARY

Exemplary embodiments include a method for implementing standardized enterprise warehouse system processes, including: extracting content from one or more source systems that provide a feed for the content; loading extracted content into one or more standardized data layout tables of a data control structure based upon meta-data and rules that define the data control structure, wherein the extracted content is in condition for transformation and data warehouse loading, and the standardized data layout tables comprise a logical data model; propagating the extracted content into a physical data model, and updating the physical data model upon the detection of a data event.

Other exemplary embodiments include a system for implementing standardized enterprise warehouse system processes, including: a processor in communication with one or more source systems via a communications link, the one or more source systems providing a feed for content; and a data standardization application executing on the processor, the data standardization application implementing: extracting content from one or more source systems that provide a feed for the content; loading extracted content into one or more standardized data layout tables of a data control structure based upon meta-data and rules that define the data control structure, wherein the extracted content is in condition for transformation and data warehouse loading, and the standardized data layout tables comprise a logical data model; propagating the extracted content into a physical data model, and updating the physical data model upon the detection of a data event.

Yet further exemplary embodiments include a computer program product for implementing standardized enterprise warehouse system processes, the computer program product including instructions for implementing a method, including: extracting content from one or more source systems that provide a feed for the content; loading extracted content into one or more standardized data layout tables of a data control structure based upon meta-data and rules that define the data control structure, wherein the extracted content is in condition for transformation and data warehouse loading, and the standardized data layout tables comprise a logical data model; propagating the extracted content into a physical data model, and updating the physical data model upon the detection of a data event.

Other systems, methods, and/or computer program products according to exemplary embodiments will be or become apparent to one with skill in the art upon review of the following drawings and detailed description. It is intended that all such additional systems, methods, and/or computer program products be included within this description, be within the scope of the exemplary embodiments, and be protected by the accompanying claims.

BRIEF DESCRIPTION OF DRAWINGS

Referring now to the drawings wherein like elements are numbered alike in the several FIGURES:

FIG. 6 is diagram of a graphical user interface (GUI) that displays some performance information and metrics on trunk group traffic usage in exemplary embodiments;

Figure 8:
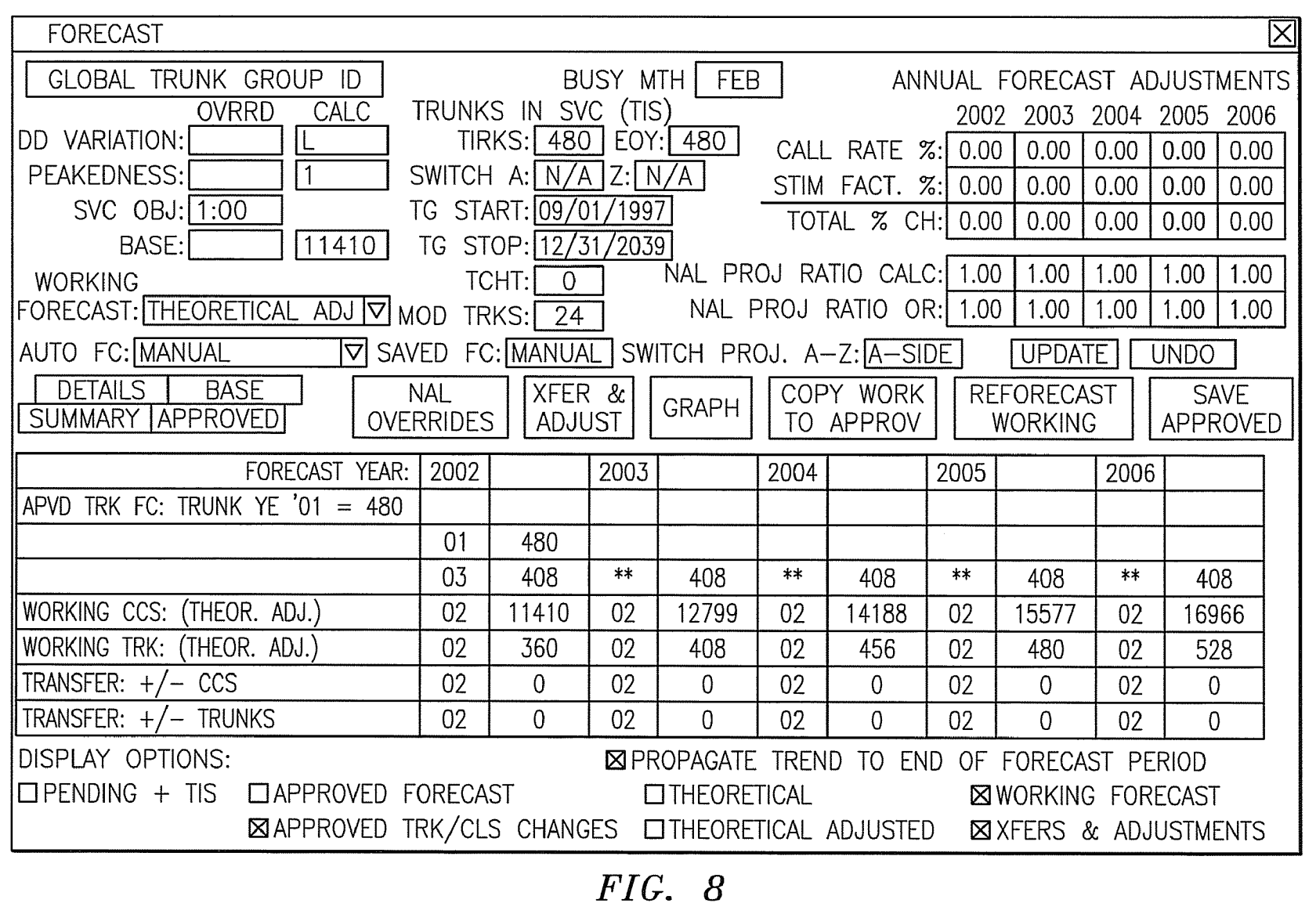

FIG. 8 is diagram of a graphical user interface (GUI) that displays some of the forecasting options that are available to a network planner or designer to efficiently allocate enough trunk resources to meet the demanded service level without needlessly deploying costly over capacity in exemplary embodiments;

Figure 1:
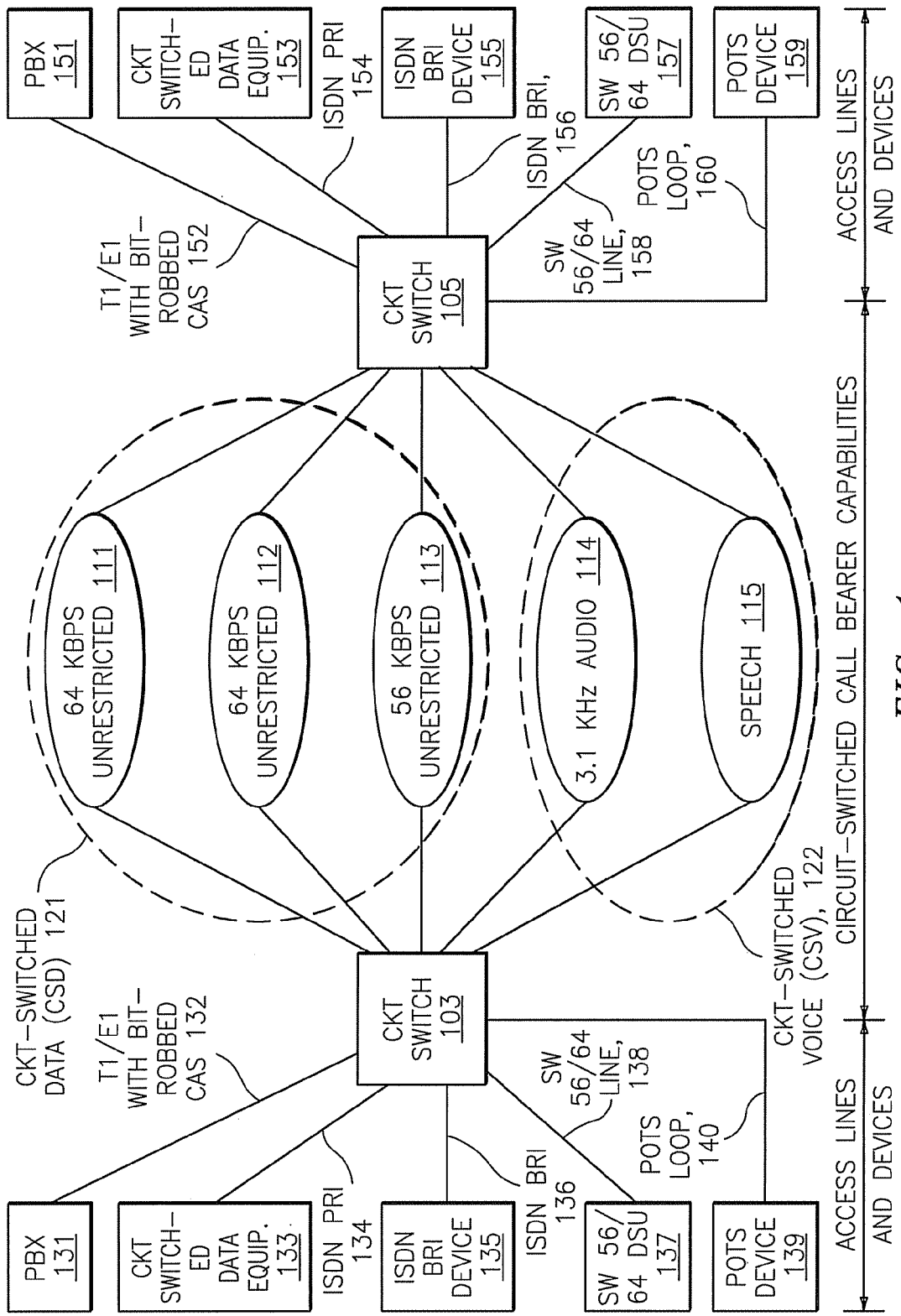
FIG. 1 is a diagram of various non-limiting types of access lines that can utilize some of the bear capabilities on trunk groups between switches in exemplary embodiments.

The detailed description explains the exemplary embodiments, together with advantages and features, by way of example with reference to the drawings.

DETAILED DESCRIPTION OF EXEMPLARY EMBODIMENTS

Reference is now made in detail to the description of the exemplary embodiments as illustrated in the drawings. While several embodiments are described in connection with these drawings, there is no intent to limit the embodiment or embodiments disclosed herein. On the contrary, the intent is to cover all alternatives, modifications, and equivalents.

Briefly described, in architecture, embodiments of the method among others, are implemented as follows. Trunks are monitored to collect usage data, which is then analyzed including the computation of time-moving averages. Based on the analyzed data, forecasts of expected trunking capacity requirements are prepared. The forecasts are entered and displayed through a graphical user interface (GUI). Network equipment and facilities can be provisioned to support the forecast, and connection routing can be optimized to use the provisioned equipment and facilities.

FIG. 1 shows two circuit switches 103 and 105 interconnected by one or more trunk groups of various bearer capabilities. In particular, the following circuit-switched bearer capabilities often are found in telecommunications networks: 64 kbps unrestricted 111, 64 kbps restricted 112, 56 kbps unrestricted 113, 3.1 KHz audio 114, and speech 115. Generally, these bearer capabilities can be used to mark or identify the capabilities of different types of historical trunk groups in the telephone network.

As one skilled in the art will be aware, the 64 kbps unrestricted 111 bearer capability supports 64 kbps using Binary 8-bit Zero Suppression (B8ZS) to maintain pulse density or one's density for T1 transmission equipment synchronization clocking, while the 64 kbps restricted 112 bearer capability supports 64 kbps, but requires the customer devices or data to be restricted to meet the one's density or pulse density requirements to maintain T1 repeater synchronization clocking. The 56 kbps unrestricted 113 bearer capability will work over trunk groups that do not support B8ZS and clear channel 64 kbps capability. The 3.1 KHz audio 114 bearer capability can be used to identify trunk groups supporting the transmission of 3.1 KHz audio channels. If any older FDM analog trunks still exist in some telecommunications network, these trunks could be marked with the capability of bearing 3.1 KHz audio. In addition, the speech 115 bearer capability can be used to mark or identify trunk groups that are only designed for carrying human voice. For example, time-assigned speech interpolation (TASI) was a technology used on older transatlantic cables to allow 30 voice phone calls over a T1 instead of the normal limit of 24. TASI worked by talking advantage of the normally half-duplex nature of human voice conversations. Trunk groups using such half-duplex communication might not be able to carry analog modem or fax communications that expect a full-duplex 3.1 KHz audio channel, which may be simulated through claw or A-law PCM at 56/64 kbps. Furthermore, a trunk group could be installed that supports other types of voice compression such as G.726 32 kbps ADPCM or G.729 8 kbps CELP. While the channels on such a trunk group take advantage of the particular nature of human voice communications to save on bandwidth, such channels might not be capable of handling analog modem or fax communications that expect a full-duplex 3.1 KHz audio connection, which may be simulated through μ law or A-law PCM at 56/64 kbps.

While most modem telecommunications switches support the bearer capabilities of 64 kbps unrestricted 111, 64 kbps restricted 112, 56 kbps unrestricted 113, 3.1 KHz audio 114, and speech 115, today most trunk groups in major networks utilize 64 kbps clear channel DS0 s. A 64 kbps clear channel generally will support or simulate the capabilities of the other possible requested bearer capabilities. However, the call routing for the switches generally has to be configured based on routing calls of particular bearer capabilities over trunk groups that will either natively support or transparently simulate the bearer capability. Thus, when programming the switch translations or configuring the switches, the switch administrators often must set up the call routing for the switches based on these different bearer capabilities. However, many database systems only keep track of whether a trunk group supports circuit-switched data (CSD) 121 or circuit-switched voice (CSV) 122. Thus, the individual bearer capabilities of 64 kbps unrestricted 111, 64 kbps restricted 112, and 56 kbps unrestricted 113 are often grouped together as CSD, while the individual bearer capabilities of 3.1 KHz audio 114 and speech 115 are often grouped together as CSV.

In addition to the trunks and trunk groups between switches, circuit switches 103 and 105 are shown supporting various non-limiting types of access lines and devices. In particular, circuit switch 103 is shown connected to a private branch exchange (PBX) 131 over a T1/E1 line with bit-robbed channel associated signaling (CAS) 132, connected to circuit-switched data equipment 133 over an ISDN Primary Rate Interface (PRI) 134, connected to an ISDN Basic Rate Interface (BRI) device 135 over an ISDN BRI 136, connected to a switched 56/64 kbps data service unit (DSU) 137 over a switched 56/64 kbps access line 138, and connected to a POTS device 139 over a POTS loop 140. Also, circuit switch 105 is shown connected to a private branch exchange (PBX) 151 over a T1/E1 line with bit-robbed channel associated signaling (CAS) 152, connected to circuit-switched data equipment 153 over an ISDN Primary Rate Interface (PRI) 154, connected to an ISDN Basic Rate Interface (BRI) device 155 over an ISDN BRI 156, connected to a switched 56/64 kbps data service unit (DSU) 157 over a switched 56/64 kbps access line 158, and connected to a POTS device 159 over a POTS loop 160.

The various types of access devices generally utilize various signaling techniques to originate connections or calls through the network. If the access line associated with the called address or destination phone number is a loop off of the same switch as the access line that is originating the call, then the call generally is completed using the switching fabric within the single switch that is the origination and destination of the call. On the other hand, if the access line associated with the called address or destination phone number is connected to a different switch than the switch that supports the access line originating the call, then the call or connection generally is carried over one or more trunk groups between switches and may transverse some intervening switches as well.

Some of the types of access lines have less sophisticated signaling methods for initiating calls or connections, and normally these less sophisticated types of signaling methods cannot request specific bearer capabilities for the call from the network. As a non-limiting example, a POTS device 139 or 159 (such as, but not limited to, an analog phone) can signal the destination address using either rotary pulse dialing or dual-tone multi-frequency (DTMF) touch tone dialing. However, a POTS phone cannot specify the bearer capability for a particular call or connection. Thus, the switches generally automatically specify calls from and to POTS loop devices with bearer capabilities of 3.1 KHz audio 114 and/or speech 115. Also, switched 56/64 DSUs 137 and 157 sometimes support a DTMF dialing procedure to signal the network to establish a 56 kbps or 64 kbps connection to the destination phone number specified in the DTMF dialing. Still, switched 56 and switched 64 DSUs generally do not have a signaling mechanism for specifying the bearer capability of particular calls or connections. As a result, the switches generally automatically specify calls from and to switched 56 devices with bearer capabilities of 56 kbps unrestricted 113 and specify calls from and to switched 64 devices with bearer capabilities of 64 kbps unrestricted 111 or 64 kbps restricted 112. In contrast, ISDN PRI and BRI devices have a D-channel for sending digital messages that not only specify the destination address or called party number but also specify the requested bearer capability through the network. Therefore, ISDN BRI and PRI devices, with the proper switch translations, can signal the network to establish calls with various capabilities that terminate on different types of network access lines. For instance, an ISDN BRI device 135 could initiate a 3.1 KHz audio 114 or speech 115 call to a POTS device 139. In addition, the same ISDN BRI device 135 could initiate a 64 kbps unrestricted 111 call to a switched 64 DSU 137. Although not shown in FIG. 1, devices on ISDN access lines often can access packet-switched services as well as circuit-switched services. Thus, ISDN devices provide Integrated access to the Services in the Digital Network. Based on the particular bearer capabilities supported by various types of access lines or loops, the connection or call routing through the network switches and over trunk groups is configured to handle the different types of bearer capabilities for various destination or called addresses, which are usually more commonly known as phone numbers.

Figure 2:
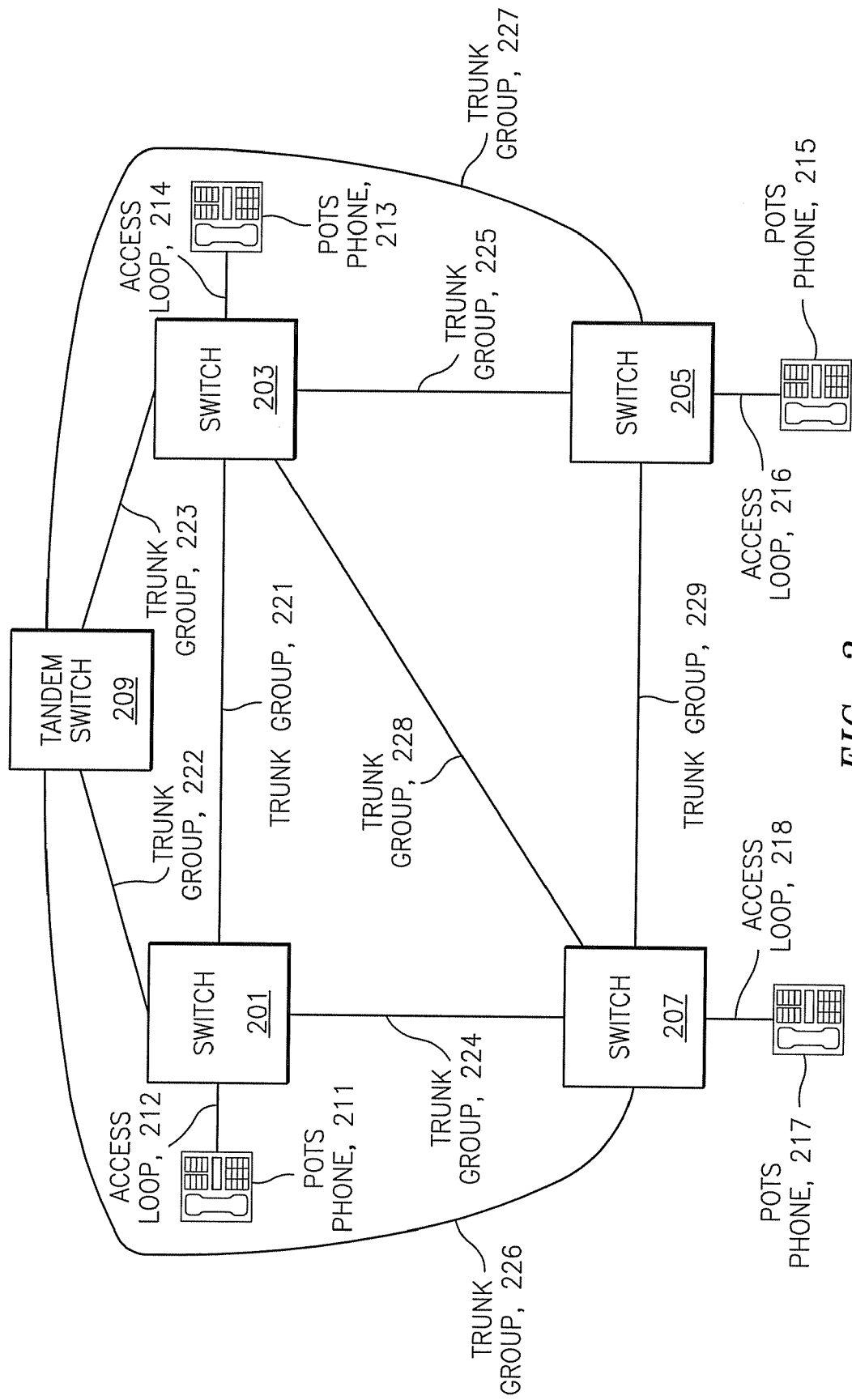
FIG. 2 is a diagram of an example telecommunications network with switches, trunks, and access lines or loops in exemplary embodiments.

Moving now to FIG. 2, which shows an interconnected network of several switches and trunks or trunk groups. While not shown in FIG. 2, trunk groups and connection/call routing actually are based on the bearer capabilities and/or connection type of CSV or CSD that were described with respect to FIG. 1. For simplicity, FIG. 2 will be described only with respect to voice telephone calls, but one skilled in the art will recognize the application to other types of connection-oriented communications such as, but not limited to, CSD. FIG. 2 shows switches 201, 203, 205, and 207 as well as tandem switch 209. Switch 201 is connected to POTS phone 211 over access loop 212, while switch 203 is connected to POTS phone 213 over access loop 214. Also, switch 205 is connected to POTS phone 215 over access loop 216, and switch 207 is connected to POTS phone 217 over access loop 218.

In addition, nine trunk groups 221, 222, 223, 224, 225, 226, 227, 228, and 229 interconnect some but not all of the pairs of switches. The network of switches does not form a complete mesh because there is no direct trunk group connection between switch 201 and switch 205. In general, a complete mesh network for 5 switches would need direct connections between each pair of switches. Mathematically, the number of connections needed for a complete mesh network of 5 switches can be computed as the combinations of 5 switches taken 2 at a time (or pairwise). Therefore, for a complete mesh network of 5 switches, the total number of trunk connections needed would be 5!/[2!(5−2)!]=5!/[2!×3!]=5×4/2=10. However, implementation of such a complete mesh network generally would be overly expensive, especially as the number of switches in the network becomes larger. Therefore, network designers and planners generally utilize intermediate switches in some routes to reduce the number of direct connections needed between each switch.

As an example, there is no direct connection between switch 201 and 205. Therefore, a phone call from POTS phone 211 to POTS phone 215 might transverse the following path: access loop 212, switch 201, trunk group 222, tandem switch 209, trunk group 227, switch 205, and access loop 216. Tandem switch 209 can be used an intermediate switch for connecting the calls between access loops on switch 201 and access loops on switch 205. Furthermore, while tandem switch 209 is shown without any access loops or lines, the tandem function often can be performed by switches that also support subscriber access lines. For instance, a phone call from POTS phone 211 to POTS phone 215 might transverse the following path: access loop 212, switch 201, trunk group 224, switch 207, trunk group 229, switch 205, and access loop 216. In such a situation, switch 207 is performing a tandem function in addition to supporting subscriber loops. Usually the tandem function involves special software loads and/or software configurations on a switch, and sometimes various switch hardware is optimized for performing the tandem function in contrast to providing the access loop support function. Thus, in large telecommunications networks some switches (such as switch 209) may be strictly utilized for performing the tandem function, while other switches (such as switches 201, 203, 205, and 207) may be strictly utilized for supporting subscriber loop access without supporting any tandem functionality. However, switching equipment often can be configured to support different applications such as, but not limited to, the tandem function and the subscriber loop support function.

While FIG. 2 shows the concept of trunk groups interconnecting switches and the concept of tandem switching, one skilled in the art will be aware that actual network implementations are somewhat more complex. In modem networks, switches are normally interconnected by SONET rings that carry the channels for trunk groups. Usually the SONET rings are connected to multiplexers, digital cross-connects, or channel banks (not shown in FIG. 2) that drop and insert channels into the SONET ring to support the trunk groups between switches that are shown in FIG. 2. In addition, the network signaling messages between switches to establish and tear down connections normally are carried over a packet network known as Signaling System No. 1 or SS7. In SS7 terminology, the switches for customer service connections are known as service switching points (SSPs), while packet switches used to forward SS7 signaling messages are known as signaling transfer points (STPs). Databases that provide for intelligent service delivery are known as service control points (SCPs).

As described previously, although the telephone network developed using analog technology with analog space-division switches and analog frequency-division multiplexing (FDM) for call trunking, the network generally has evolved to digital switches and digital time-division multiplexing (TDM) trunks that support both analog access loops (such as POTS lines) as well as digital access loops (such as ISDN BRIs). Even with the changes to a digital architecture, the primary technology presently used in the PSTN is circuit switching. In the future, various packet switching technologies could be used for handling phone calls or other connection-oriented services. These statistically-multiplexed packet-switching technologies likely would utilize a virtual circuit as opposed to datagram packet switching paradigm to offer connection-oriented service because virtual-circuit packet switching is connection-oriented, while datagram packet switching is connectionless. In addition, traffic measurements based on CCS or Erlangs generally would be based on some standardized amount of bandwidth resource allocation (and/or multiples of that standard) for each connection, call, or virtual circuit because one of the base units or quanta of resource allocation in a call-second or connection-second is a call or connection using up one channel of communication resources to carry the call or connection. Completely variable bit rate applications over statistically multiplexed packet switching networks generally do not have the same quanta of resource usage or the resource usage varies over time for each virtual connection or flow of datagrams. Therefore, the CCS and Erlang metrics generally are not applicable to such completely variable bit rate applications on statistically multiplexed packet switching networks.

Figure 3:
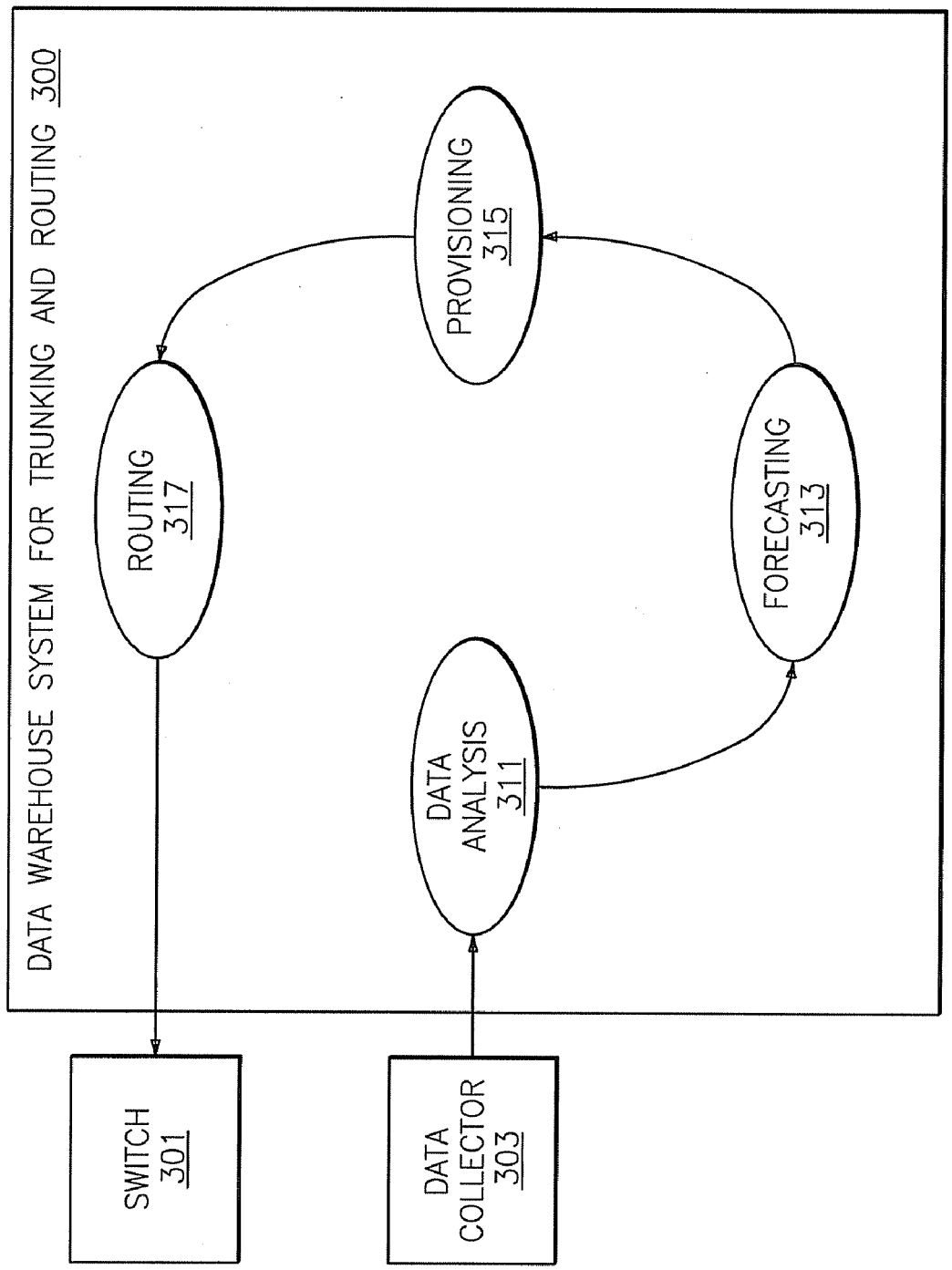
FIG. 3 shows some of the functions in a data warehouse and analytical processing system for trunking and routing in exemplary embodiments.

FIG. 3 shows one non-limiting embodiment of data warehouse system for trunking and routing. In general, data warehousing and On-Line Analytical Processing (OLAP) are decision support technologies to facilitate managerial resource allocation and cost structure decisions. While data warehousing often utilizes some of the concepts of common database technology, the performance requirements and demands on data warehousing systems are often quite different from the demands on database systems that support operational functions such as on-line transaction processing (OLTP) systems that often automate clerical record keeping tasks. In contrast, data warehousing systems are designed to help decision makers with tasks such as, but not limited to, data aggregation, data filtering, and data selection to produce relevant information that allows the decision maker to make better economic business decisions on resource allocations. Because of the vast amount of data that may be relevant to a decision maker or resource manager, data warehouses normally are much larger database systems than OLTP database systems.

In FIG. 3 trunk usage data from switch 301 is collected by data collector 303. This trunk usage information is passed into data warehouse 300 where data analysis 311 is performed. Based on the data analysis 311, one or more forecasts of trunk group capacity necessary to meet various service level requirements can be produced in forecasting 313. In developing forecasts of trunk group capacity necessary to meet the demand at a specified level of service, often resource managers perform "what if" scenario analysis to evaluate potential outcomes of various decision paths and also to test how effective particular decisions would be in the event of unexpected changes in demand. After making a decision on a forecast, network resources are provisioned to meet the forecasted demand at the specified service level. Provisioning 315 normally involves configuring and/or deploying transmission facilities and equipment such as, but not limited to, digital cross-connect systems (DCS) and/or drop- and -insert multiplexers to establish the forecasted number of trunk connections in the trunk groups between various switches. If a trunk group already exists with too much excess capacity for the forecasted demand, some network equipment and/or transmission facilities may be removed from that trunk group and used for other needs in the network. If a trunk group has too little capacity for the forecasted demand, some network equipment and/or transmission facilities may be added to that trunk group to meet the service level objectives.

Once the trunk groups have been provisioned, connection or call routing 317 is performed to establish the rules for routing calls or connections over the trunk groups and through the switches based on the destination phone number. The call routing information is communicated to the switches 301 and/or the SS7 network (not shown in FIG. 3). Often call or connection routes between switches are configured with primary and alternate routes. For instance, referring to FIG. 2, trunk group 224 between switch 201 and switch 207 may be the primary route with 48 circuits for high usage (HLU) directly between switches 201 and 207. In addition, an alternate route may be defined between switches 201 and 207 through trunk group 222, tandem switch 209, and trunk group 226 that is used in the event that the primary route is completely busy (with all 48 circuits in use) or is out of service. If the alternate route through trunk group 222, tandem switch 209, and trunk group 226 between switches 201 and 207 is the last route in the routing table hierarchy between switch 201 and 207, then trunk group 222 is considered to be the final trunk group for the route from switch 201 through switch 207.

Note that the routing from switch 201 to switch 207 does not have to be the same as the routing from switch 207 to switch 201. Thus, call or connection routing hierarchies and tables are overlaid on top of the provisioned trunk groups.

When a phone call or connection cannot be completed because the destination phone line is busy, telephone call originating customers generally receive audio feedback of a slow busy signal of 60 cycles per minute. When a call or connection cannot be completed because the network is busy, telephone call originating customers generally receive audio feedback of a fast busy signal of 120 cycles per minute. The fast busy signal can occur when the telephone switches do not have enough resources to switch the call to the destination. Also, a fast busy signal can occur when all of the in-service trunk circuits in a route are in use. For example, suppose that the primary route from switch 201 to switch 207 over high usage trunk group 224 contains 48 trunk circuits, while an alternate (and final) route from switch 201 to switch 207 over final trunk group 222, through tandem switch 209, and over trunk group 226 contains 24 trunk circuits. In such a situation, if there are currently 48+24=72 calls or connections from switch 201 to switch 209, then the 73rd caller from switch 201 to switch 207 will receive the network fast busy tone indicating that the network does not have enough resources (in this case trunks or trunk circuits) to complete the call.

Figure 4:
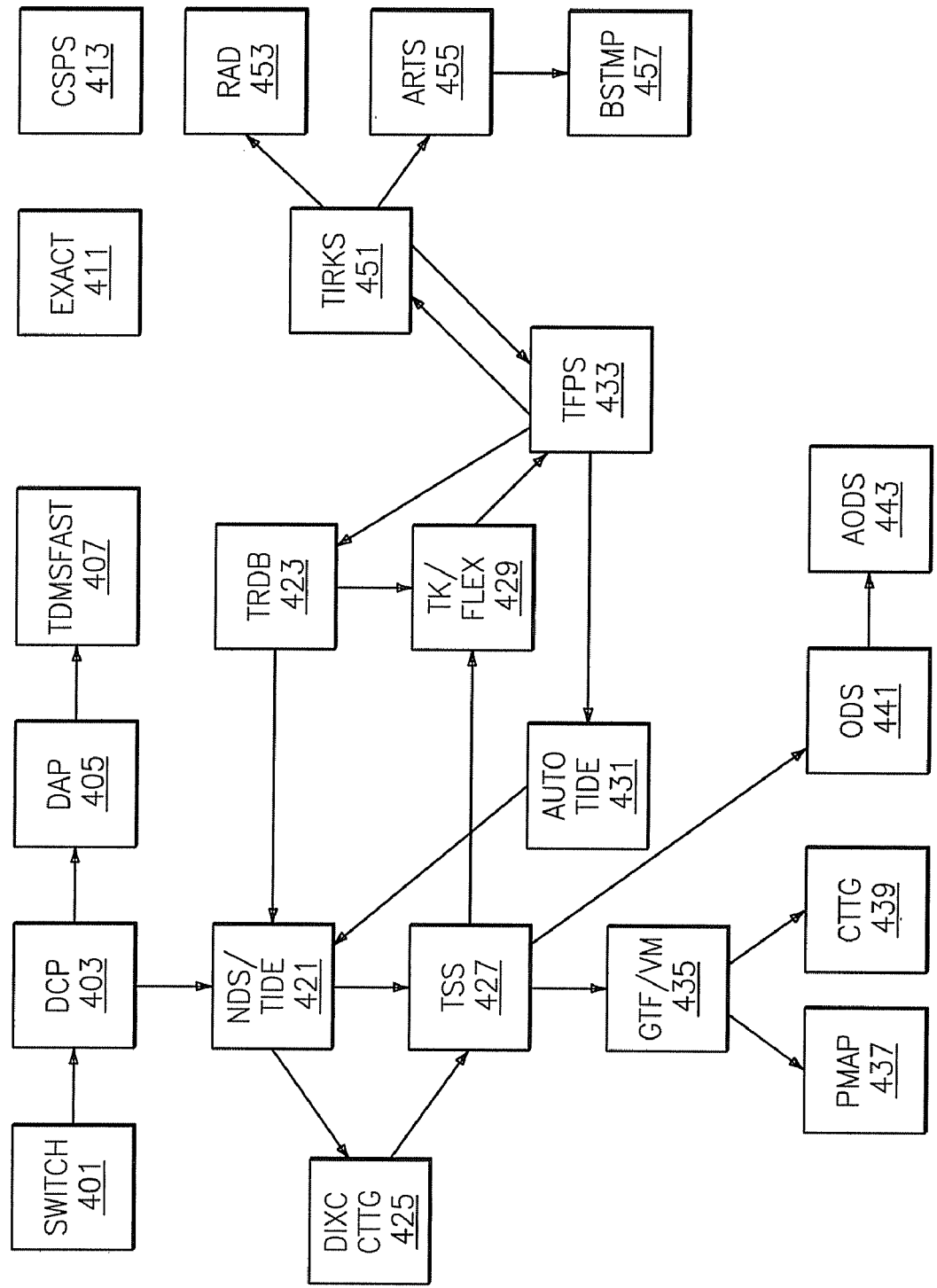
FIG. 4 is detailed diagram of a conventional non-data warehouse example system for trunking and routing decision making.

FIG. 4 shows a conventional non-data warehouse system for analyzing trunk group usage and forecasting trunk group load levels. Before the invention much of the system as shown in FIG. 4 was not even automated, and some of the arrows as shown in FIG. 4 represented data flows of paper records as opposed to electronic files. In addition, the relevant data was not consolidated into a single system, and some systems with relevant data related to trunk groups were completely isolated from the process. Therefore, the inefficiencies in the system shown in FIG. 4 led to the forecasting process generally being performed yearly or, at best quarterly.

As shown in FIG. 4, switch 401 produces trunk usage data that is collected by data collection processor (DCP) 403, which forwards information to DAP system 405 and network data system/traffic information distributor and editor (NDS/TIDE) 421. DAP 405 further provided information to traffic data management system—fast (TDMSFast) 407. NDS/TIDE 421 provided output to data interchange—common transport trunk (DIXC CTTG) 425 and to trunk servicing system (TSS) 427. The NDS/TIDE 427 system receives input from the traffic routing database (TRDB) 423 and from an auto TIDE system 431 that automates some of the traffic information distribution and editing functions. TK/FLEX system 429 received information from TRDB 423 and TSS 427, and generated an output to the trunk forecasting and provisioning system (TFPS) 433. Furthermore, TSS 427 provided input to GTF/VM 435, which was a general trunk forecasting (GTF) system run on a computer using the virtual machine (VM) operating system. GTF/VM 435 interfaced to common transport trunk group (CTTG) system 439 and interfaced to the performance monitoring and analysis program (PMAP) 437 that collects data and produces metrics and reports on network performance. Also, TSS 427 provided input to ODS 441, which was overlaid with AODS 443. ODS 441 is the Online Database System, while AODS 443 is the Advanced Online Database System. ODS 441 provided electronic access to traffic data from TSS 427 using a character-based user interface. AODS 443 overlaid a graphical user interface (GUI) on the traffic data information in ODS 441.

As shown in FIG. 4, EXACT 411 system and CSPS 413 system, which both contain relevant information related to trunking and/or routing, were not even in communication with the other systems. EXACT 411 is an EXchange Access Control Tracking system that processes access service requests (ASRs) for other telecommunications carriers such as but not limited to competitive local exchange carriers (CLECs) and interexchange carriers (IXCs). Generally these ASRs are requests for trunk-side access to the switch as opposed to the loop-side access usually sought by network customers. CSPS 413 is the Complex Services Profile System that processes service inquiries and requests for complex telecommunication services such as but not limited to primary rate interface (PRI) ISDN and metropolitan Ethernet.

In addition, TFPS 433 interfaced with TIRKS 451, which is the BellCore/Telcordia Trunk Information Record Keeping System that is known in the art and that among other things maintains an inventory of trunking facilities in the network. RAD 453 is the Report Analyzer for Diversity system, which analyzes interoffice trunks to ensure diversity at the facility level by verifying that there is not a single point of failure common to a pair of circuits carrying high priority services such as but not limited to E911 for which a higher reliability is expected. BSTMP 457 is BellSouth's Trunk Maintenance Program that helps to identify trunk groups with potential maintenance or operational problems that should be investigated further by network technicians.

Figure 5:
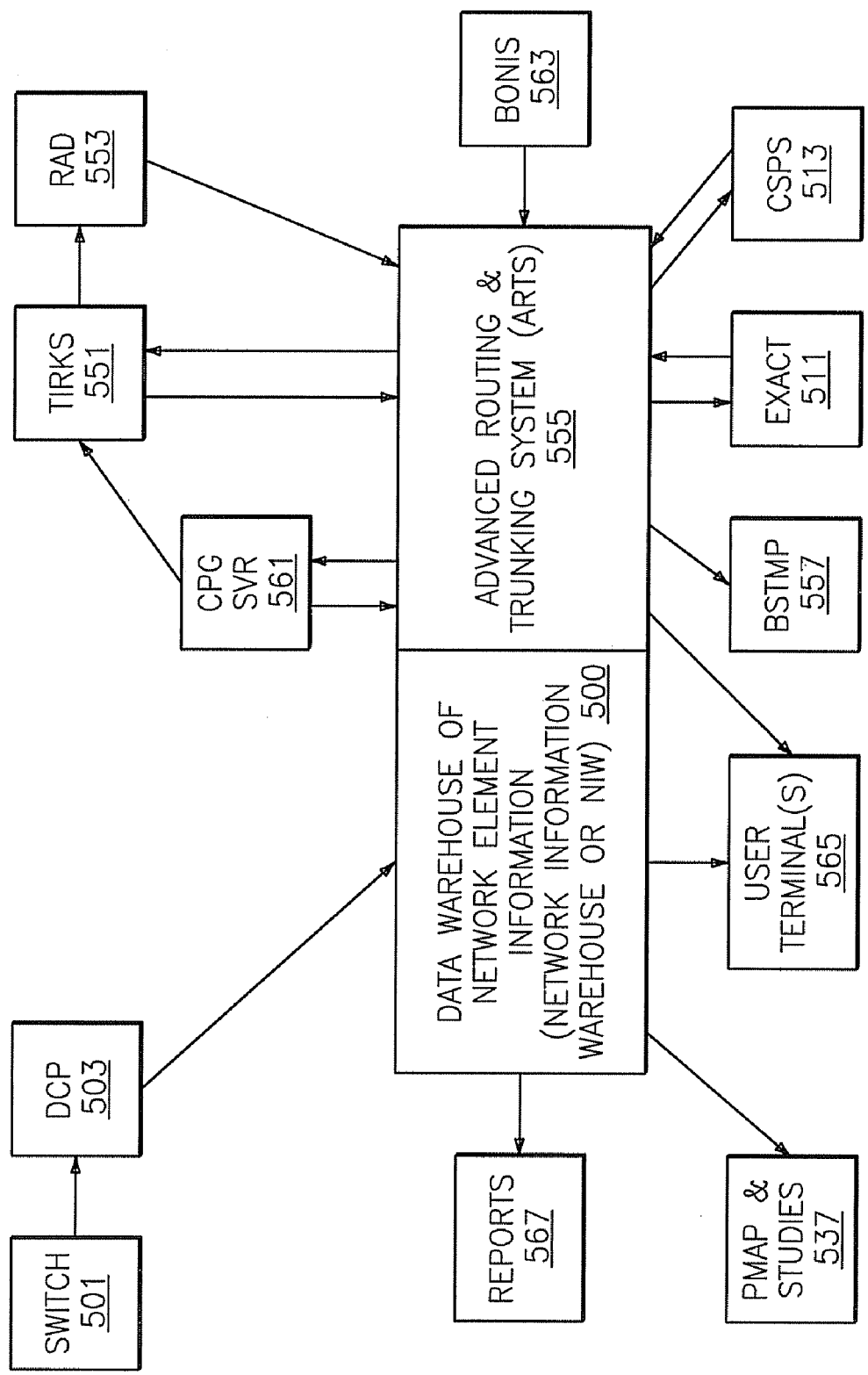
FIG. 5 is detailed diagram of a data warehouse example system that consolidates relevant information to make advanced analytical business decisions on trunking and routing network deployments and configurations in exemplary embodiments.

Turning now to FIG. 5, which shows a data warehousing system to support trunk group traffic capacity planning and connection routing through switches and over the trunk groups. In contrast to FIG. 4, data warehouse of network element information 500, which also could be called a network information warehouse or NIW, consolidates the large quantity of information on network trunks including, but not limited to, information on trunk traffic usage, current network configuration, planned network changes, and expected changes in demands for connections over the network and trunk groups. In FIG. 5 some but not all of the information flows between systems are shown with arrows. In particular, switches (such as switch 501) generate real-time or at least near real-time traffic data on trunk usage that is collected by data collection processor (DCP) 503. This trunk usage data is forwarded from DCP 503 to data warehouse 500. Data warehouse of network element information 500 generally is a database containing the data for performing online analytical processing (OLAP). Data warehouse 500 is integrally connected to advanced routing and trunking system (ARTS) 555, which performs the analytical processing of the data.

ARTS 555 communicates with other systems including but not limited to EXACT 511, CSPS 513, TIRKS 551, RAD 553, BSTMP 557, CPG server 561, BONIS 563, and user terminal(s) 565. In addition, data warehouse 500 may communicate with a system for PMAP and studies 537, may generate reports 567, and may interact with user terminal(s) 565. The EXACT 511 system is an EXchange Access Control Tracking system that processes access service requests (ASRs) for other telecommunications carriers such as but not limited to competitive local exchange carriers (CLECs) and interexchange carriers (IXCs). Generally these ASRs are requests for trunk-side access to the switch as opposed to the loop-side access usually sought by network customers. In FIG. 5, the ASRs in EXACT 511 are used to more accurately forecast trunk group requirements as an input into ARTS 555. CSPS 513 is the Complex Services Profile System that processes service inquiries and requests for complex telecommunication services such as but not limited to primary rate interface (PRI) ISDN and metropolitan Ethernet. TIRKS 551 is the BellCore/Telcordia Trunk Information Record Keeping System that is known in the art and that among other things maintains an inventory of trunking facilities in the network.

RAD 553 is the Report Analyzer for Diversity system, which analyzes interoffice trunks to ensure diversity at the facility level by verifying that there is not a single point of failure common to a pair of circuits carrying high priority services such as but not limited to E911 for which a higher reliability is expected. BSTMP 557 is Bell South's Trunk Maintenance Program that helps to identify trunk groups with potential maintenance or operational problems that should be investigated further by network technicians. CPG server 561 is a server for the Complex Provisioning Group that processes complex trunk orders based on the information from ARTS 555. BONIS 563 is BellSouth's Online NPA/NXX Information System that handles number plan area (NPA) and NXX exchange information. In addition, the LERG system is the Local Exchange Routing Guide that provides NPA/NXX assignment information for the North American Numbering Plan (NANP). PMAP 537 is the Performance Monitoring and Analysis Program that collects data and produces metrics and reports on network performance.

Figure 7:
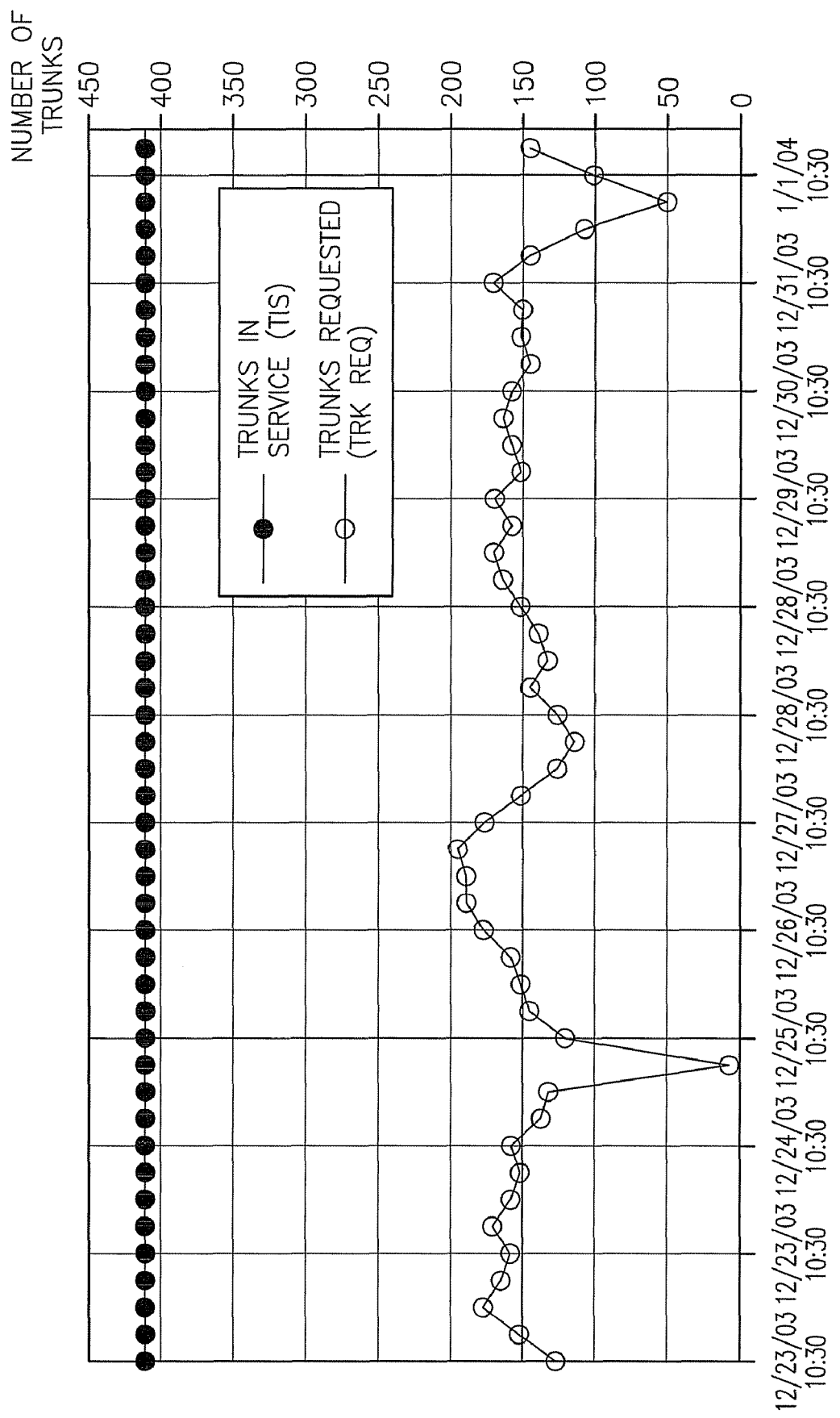
FIG. 7 is a performance usage graph comparing over time the trunks in service versus the number of trunks requested to support the call or connection volume over the trunks in exemplary embodiments.

Additional functionality of the data warehousing system elements of FIG. 5 is shown and described further in FIGS. 6-8. Also, alternative exemplary embodiments of the data warehouse system and processes of FIG. 5 are shown and described in FIGS. 9-15.

FIG. 6 shows a graphical user interface (GUI) screen that displays some of the performance data and metrics for a trunk group. Normally in large networks, trunk groups are assigned a global identifier (ID) such as a trunk group serial number (TGSN) that usually uniquely identifies the trunk group within that network. Thus, displaying performance data on a trunk group normally involves selecting the trunk group by specifying the global ID or TGSN. In addition, trunk groups connect two switches in switching offices that also usually are associated with identifiers in large networks. As one skilled in the art will be aware, the Common Language Location Identifier (CLLI) code is often used in large carrier networks to specify central office (CO) switches. Because trunk groups connect two switches, the two ends of the trunk group often are identified as office A and office Z for reference purposes. Furthermore, in addition to a global ID or TGSN within the network, normally each switch has a local identifier for a trunk group.

As shown in FIG. 6, the GUI has radio buttons to allow the user to select a view of the current real-time or near real-time trunk group usage as of, e.g., the current day (i.e., today) or to select historical views of previous trunk group usage based on starting and ending dates and times. In an exemplary embodiment, the trunk group usage data is displayed for 30 minute reporting intervals, although other embodiments could have different reporting intervals. The scroll bars and arrows allow the GUI user to scroll through the trunk group usage data for various time periods. The GUI in FIG. 6 shows tables of trunk group usage for both the A-side switch or office as well as the Z-side switch or office.

In the A-side table or office A table, the first entry row shows that the data on Jan. 1, 2004 at a time of 12:00 had a peg count (PC) in of 382 and a peg count (PC) out of 984. Peg count is a historical term that relates back to the time when trunks were connected to pegs on the switches. Essentially, the peg count is the number of phone calls or connections made over the trunk during the period with "PC In" being the number of inbound connections and "PC Out" being the number of outbound connections. Overflow (OVFL) is the number of calls or connections that had to overflow to alternate trunk groups because a trunk group higher in the routing priority could not handle the call. Overflow percentage (% OVFL) is the number of overflows divided by the peg count out (PC Out). Hold time is the average hold time for inbound and outbound calls or connections as computed by the equation of: Hold time=Usage (in CCS)×100/(PC In+PC Out−OVFL). As an example calculation for the 12:00 time period, 2860 CCS×(100 call-seconds/CCS)/(382 calls+984 calls−0 calls)=209 seconds, which is the average hold time for the calls or connections. Usage is the load or volume in centum call-seconds (CCS) on the trunk group for both inbound and outbound calls. MAINT is the total time in seconds that the trunk group is used for maintenance, while NMB or Number Made Busy is the number of trunks that are out of service for maintenance, which is equal to MAINT/36 because a single trunk can support 3600 call-seconds or 36 centum call-seconds in one hour.

The Z-side table or office Z table has similar information on the trunk group as the information contained in the A-side or office A table. However, for the Z-side table the peg count directions are reversed relative to the A-side table. For example, on Jan. 1, 2004 at 12:00 the A-side table lists PC In of 382 and a PC Out of 984, while the Z-side table at the same time lists PC In of 984 and a PC Out of 382. Generally, the A-side and Z-side call or connection statistics should be consistent unless there has been some mistake or error in the data collected from one or both of the A and Z offices or switches.

In addition to displaying the trunk group statistics in a graphical user interface, FIG. 6 also displays a computed busy hour and the connection volume or load during that busy hour. Because the data warehouse 500 contains the consolidated information to make busy hour calculations much more frequently than the approximate yearly busy hour determination of previous systems, in an exemplary embodiment the daily busy hour is calculated on at least a weekly basis. According to an exemplary embodiment the Daily Busy Hour for each trunk group is determined (weekly) by selecting the highest busy hour Average Offered Load for the group from the busy hour averages calculated based upon a rolling 30 day period. Generally, all valid measurements are used in these calculations except for measurements that are flagged for exclusion. This Daily Busy Hour is determined by using the valid data (which excludes data flagged as being unrepresentative) for each half-hour increment (48 half-hours in a 24 hour day) of each of the last 30 days (matrix 48×30) to calculate the Average Offered Load for the trunk group. The Daily Busy Hour for the trunk group is selected as starting at the half-hour (from 48 points of data) with the highest Average Offered Load. This Daily Busy Hour then is used for the next seven days, when running daily blocking reports.

In addition to the Daily Busy Hour, the data warehouse 500 is used with ARTS 555 to compute a control hour for a cluster of network switches and trunk groups. A cluster is a community of interest in which there is some locality of connections or calling patterns. Instead of just optimizing trunk sizing based on the busy hour for particular trunk groups, the control hour for a group of switches determines essentially the busiest time for that group of switches, which will not necessarily be the same as the busy hours for the individual trunk groups between the switches. The grouping of switches into clusters of communities of interest allows more efficient network trunk group resource forecasting and deployments that are based on a computation of a control hour as opposed to the individual busy hours for each trunk group in the cluster. In general, a community of interest is identified based on calling patterns that indicate some locality of access among the switches in the group or cluster in relation to calling patterns that indicate relatively less communications traveling across the boundary between the clustered group of switches and other switches not in the cluster.

The Cluster Busy Hour can be calculated through a few operations. For example, first, for each trunk group in the cluster, using the matrix of 30 days by 48 half-hour time periods, calculate the average Offered Load for each time period, while excluding any days that are flagged as unrepresentative from the calculation. Next, the highest average Offered Load, from the 48 averages, is the busy hour for the trunk group. For each cluster of trunk groups, using the matrix of 30 days by 48 time periods, the trunk group Average Offered Loads of each trunk group from the 48 periods are combined to form the offered load totals to the cluster in the 48 periods. The period with the highest offered load is the Cluster Busy Hour.

A final trunk group is the last alternate route in a hierarchical routing table after the capacity of high-usage trunks has been utilized such that additional connections overflow to alternate routes on final trunk groups. For each final trunk group, the trunk group busy hour is used as the final busy hour. The control hour for a trunk group is either the final busy hour or the cluster busy hour depending on whether the trunk group has a higher offered load at the final busy hour or at the cluster busy hour. The control hour for a trunk group is selected from the final busy hour and the cluster busy hour based on which one of those hours has the highest offered load to the trunk group.

In addition, the average offered load is calculated by averaging, for example, the 20 highest of 30 rolling days of data during the control hour, excluding data that is flagged as being unrepresentative. For example, in an exemplary embodiment the average offered load=[(A-side usage+Z-side usage)/2]/(1−% blocking), where % blocking=Overflow/PC Out. Averaging the A-side usage and the Z-side usage deals with the problem of the A-side data and the Z-side data both being valid, but still being inconsistent for some reason. If the usage data from one side of the trunk group is not considered to be valid, the averaging of the A-side and Z-side usage data should not be used in the calculation. With the use of a rolling 30-day period for many of the calculations, according to an exemplary embodiment accurate busy hour and load determinations are currently generated. This information can be used in forecasting and planning to dynamically change network equipment deployments and configurations much more responsively than previous systems that computed busy hours and network loads with a frequency of about once per year. The rolling 30-day period is a moving average type of computation that will react to systematic changes in network usage and demand, but will not be too overly sensitive to one abnormal day of network activity.

In addition, the GUI in FIG. 6 shows the circuit layout order (CLO) number from TIRKS with the due date and number of trunks to be added or disconnected. Furthermore, FIG. 6 displays the number of trunks in service (TIS) from both the switch (SW), if available, as well as from the TIRKS trunk inventory system. Sometimes, the switch translations and trunk configurations may not exactly match the trunk information contained in TIRKS. Also, FIG. 6 shows selection buttons for "Show Office Flag", "Show Cluster Data", "Graph", and "Export". The show office flag button can be used to reach screens for selecting some trunk usage data as unrepresentative and therefore excluded from various computations. The show cluster data button displays data relevant to a cluster, while the graph button graphs the trunk group load usage versus the trunks in service. As shown in FIG. 7, the trunks requested to meet demand or offered load are graphed over time in comparison to the trunks in service (TIS). In FIG. 7, the 408 trunks in service are significantly above the number of trunks requested during all time periods shown.

FIG. 8 shows the graphical user interface (GUI) for one of the forecasting screens. According to an exemplary embodiment, five different forecasting models are included. Each of these five models generate a base unadjusted forecast and also allow manual adjustments and overrides to generate adjusted forecasts. The five models may include: 1) the historical trunk group CCS growth rate model, 2) the theoretical cluster CCS growth rate model, 3) the switch CCS growth/de-growth model, 4) the historical network access line (NAL) model, and 5) the theoretical network access line (NAL) model.

The five forecasting models use a monthly busy hour offered load that is determined for each half-hour period during the month in which the load data is valid and representative. The offered load for each hour is computed as offered load=(Usage/[1−((% blocking)×retrial factor)]. In an exemplary embodiment, the retrial factor for final trunk groups and overflow trunk groups is 0.55. Next the average offered load for each hour is computed by averaging the offered loads in each hour across the valid and representative days. The hour with the highest average offered load is the busy hour for the month for the trunk group. Using this month busy hour, the average offered load is recalculated for that hour across the highest 20 days that are valid. This newly calculated average from the 20 highest valid days at the busy hour is the basing value for the month for the trunk group. The basing value is used in all the five forecast models.

The historical CCS growth rate model determines the month with the highest average offered load for a trunk group by considering, for example, the last 12 rolling months, while excluding unrepresentative months that have been flagged. The average offered load for this highest month is compared to the average offered load for the same month in the previous year to determine the change in CCS load from the previous year to the current year. This amount of CCS change is added to the present year to forecast the next year's CCS level.

The theoretical CCS growth rate model determines the month with the highest average offered load for a cluster by considering, for example, the last 12 rolling months, while excluding unrepresentative months that have been flagged. The average offered load for this highest month is compared to the average offered load for the same month in the previous year to determine the change in CCS load from the previous year to the current year. This amount of CCS change is added to the present year to forecast the next year's CCS level.

The switch CCS growth/de-growth model determines the month with the highest average offered load for a switch by considering, for example, the last 12 rolling months, while excluding unrepresentative months that have been flagged. The average offered load for this highest month is compared to the average offered load for the same month in the previous year to determine the change in CCS load from the previous year to the current year. This amount of CCS change is added to the present year to forecast the next year's CCS level.

The network access line (NAL) forecast computes the forecast CCS as Forecasted CCS per year=Base CCS*Projection Ratio*Call Rate*Stimulation Factor+/−Stated CCS+Load Transfer CCS. For the NAL forecast, Base CCS=highest base month from, for example, the last 12 months, excluding flagged unrepresentative months. The Projection Ratio can be calculated from the access line forecasts from the 'A' and/or 'Z' end Office record(s), while the Calling Rate is a stated growth rate that is not compounded yearly. Also, the Stimulation Factor is a one time method of CCS stimulation in each year, whereas the Stated CCS is a manual adjustment that can be added or subtracted by the network planner. The load transfer CCS relates to changes in load allocations amongst trunk groups. The NAL historical model uses trunk group CCS values for the base CCS. The NAL theoretical model uses cluster CCS values for the base CCS.

In the GUI screen of FIG. 8, some of the forecast settings and a summary forecast is displayed. The forecast is for a trunk group with an ID number. The busy month in the present year has been determined as February. The DD Variation is a measure of the day-to-day variance in trunk group usage, while the peakedness also is another parameter describing the statistical distribution of trunk group usage over time. The service objective (SVC OBJ) is a parameter selected to designate the desired service level that is to be provided by the trunk group. The base is the base offered load for the trunk group in CCS. Many of these values are calculated (CALC) by the system in an exemplary embodiment. In addition, some of the values allow a manual override (OVRRD) by a network planner. The working forecast pull down box allows the network planner to select one of the five forecasting models and also allows the network planner to specify whether the forecast can be manually adjusted by alteration of some model parameters.

Furthermore, the GUI screen in FIG. 8 displays the trunks in service (TIS) according to the Telcordia TIRKS trunk inventory system, the number of trunks in service at the End Of the Year, the number of trunks in service according to switch A, and the number of trunks in service according to switch Z. Also, the trunk group (TG) start and stop dates are displayed. In addition, the trunk conversion holding time (TCHT) is displayed and is the average length of a call on the trunk group. MOD TRKS specifies a modulus for adding or removing trunks in those situations where a switch or other network equipment has to add capacity in certain multiples such as in multiples of 24 DS0 s in a T1.

In FIG. 8, several forecast adjustment fields are provided for network planners. For example, the call rate % specifies the call hold time percent change, and can be set for the years 2002, 2003, 2004, 2005, and 2006. The stimulation factor % is the percent that the call volume is to be adjusted from the base year. The total % change is the compounded result of the call rate percentage and the stimulation factor percentage. Also, FIG. 8 shows the network access line (NAL) calculated projection ratios, which can be overridden by manual adjustments using the NAL PROJ RATIO OR fields. Because the NAL forecasts are based on the growth in network access lines on a switch, the selection of the A switch or the Z switch on each end of the trunk group changes the forecast. The switch projection (PROJ.) A-Z field allows a network planner to specify which switch is used in NAL forecasts. The Auto Forecast (FC) and Saved FC (Forecast) settings allow the network planner to specify the system behavior in saving and/or approving new forecasts.

Also, FIG. 8 shows various buttons and tabs for selecting and manipulating different objects associated with the forecasting task. In particular, selection of the summary tab displays the approved forecast as well as transfer and/or adjustment summary data. In FIG. 8 the summary tab has been selected, and an example forecast summary is displayed. The approved tab displays the 5 year approved forecast by month, while the details tab displays the 5 year forecast by month for the 5 forecasting models and also displays forecast versions that were adjusted by the network planner. The base tab shows the base values that are used in the theoretical and historical models.

Moreover, in FIG. 8 the NAL Overrides button shows the official network access line values as well as any override values for the A and Z offices. The transfer and adjust button provides for transfers of trunk groups and manual adjustments of trunks or offered loads. The graph button generates a graph of the forecast data. The copy working to approved button will allow the user to copy a working forecast into the approved forecast area. The reforecast working button will cause a recalculation of the forecast using any values that have been changed. The save approved button causes the approved forecast to be saved.

Thus, the forecasting features provide automatic forecasting with multiple models for changes in trunk capacity demand. In addition, the forecasting allows manual override for expert network planners that have some special knowledge, which is not reflected in the system. Also, the forecasting features allow "what if" scenario analysis to evaluate different trunking configurations and solutions.

Figure 9:
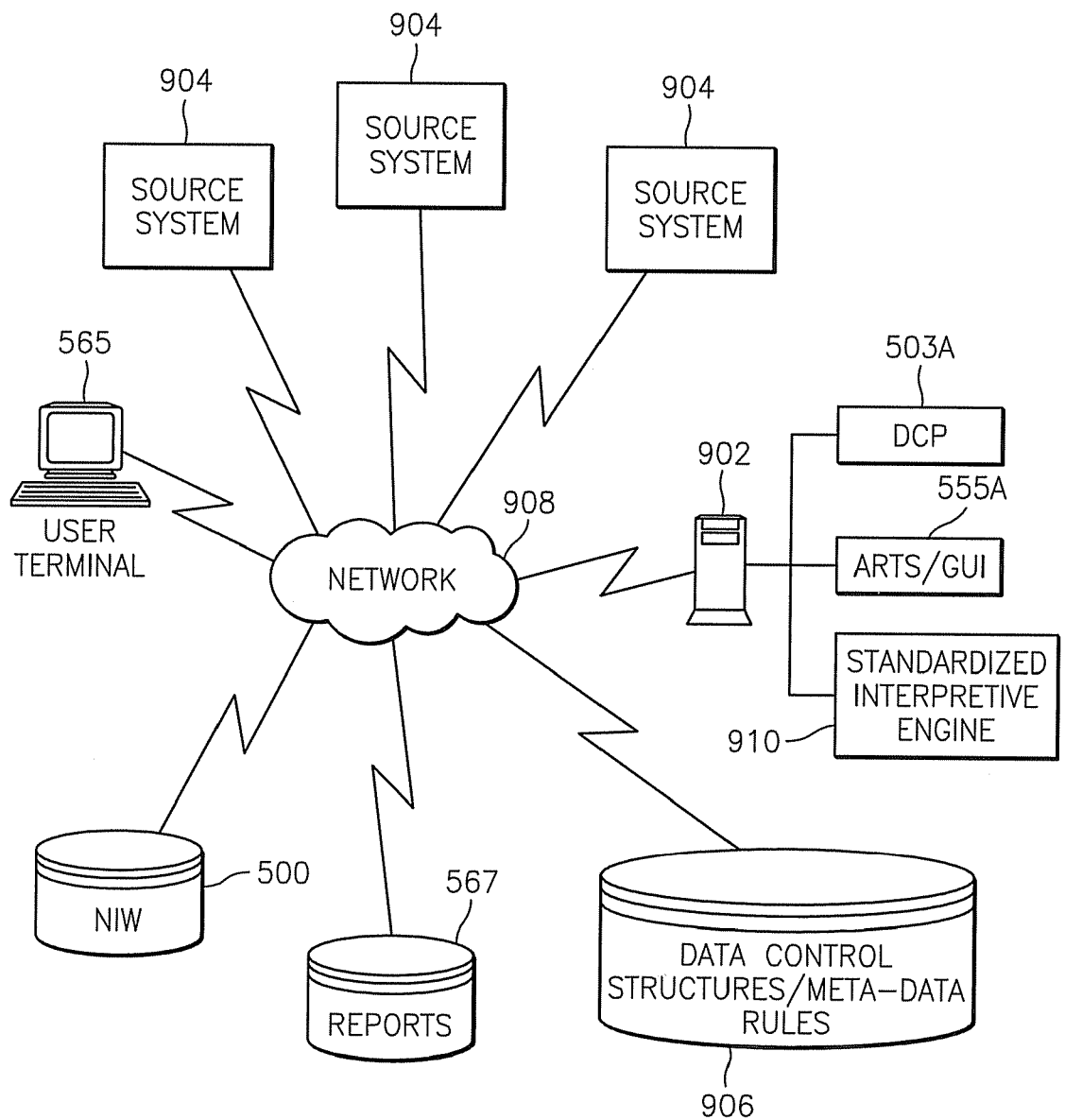
FIG. 9 is a block diagram depicting a system upon which the data standardization and transformation processes may be implemented in accordance with exemplary embodiments.

As indicated above, a data warehousing system is used to support trunk group traffic capacity planning and connection routing. An alternative exemplary embodiment of a data warehousing system is depicted in FIG. 9, with a portion of the system architecture of FIG. 5 being replaced by elements shown in the system architecture of FIG. 9. While some elements of the architecture of FIG. 5 are omitted from the architecture of FIG. 9 for clarity, it will be appreciated that the system architectures of FIGS. 5 and 9 are exemplary only and that other architectural elements may be included or excluded as appropriate. In exemplary embodiments, the system architecture of FIG. 9 differs from the architecture of FIG. 5 by the inclusion of a network and host system. The functionality of the various components of the data warehouse system of FIG. 9 will now be described in exemplary embodiments.

The system of FIG. 9 provides data standardization and transformation processes. In exemplary embodiments, the standardization processes include standardizing source systems' data into a common data structure so that existing deployed code can make use of new source systems by reference through meta-data in a manner that minimizes maintenance of the system resources and related costs. The transformation processes are described further herein (e.g., FIGS. 12 and 13).

The system depicted in FIG. 9 includes one or more user terminals 565, through which users at one or more geographic locations may contact the host system 902 to access the features provided by the data standardization and transformation processes. The user terminals 565 may be utilized to request and display reports (e.g., reports stored in database 567). The user terminals 565 are coupled to the host system 902 via a network 908. Each user terminal 565 may be implemented using a general-purpose computer executing a computer program for carrying out the processes described herein. The user terminals 565 may be implemented by personal computers and/or host attached terminals. If the user terminals 565 are personal computers (e.g., laptop, personal digital assistant), the processing described herein may be shared by a user terminal 565 and the host system 902 (e.g., by providing an applet to the user terminal).

The host system 902 is also in communication with source systems 904, data warehouse 500, and databases 567 and 906 via a network (e.g., network 908). The host system 902 executes computer instructions for handling data received from source systems.

The databases 567 and 906 may include data stores (e.g., source tables, data files, etc.) that house data received by, and/or processed by the host system 902. Each of the databases 567 and 906 may be located in the same or different geographic location and may be accessed by the host system 902 via one more or more networks with characteristics similar to the network 908 described herein. Database 906 stores data control structures, source system tables, as well as metadata and rules as described further herein.

The network 908 may be any type of known network including, but not limited to, a wide area network (WAN), a local area network (LAN), a global network (e.g. Internet, cellular), a virtual private network (VPN), and an intranet. The network 106 may be implemented using a wireless network or any kind of physical network implementation. A user terminal 565 may be coupled to the host system 902 through multiple networks (e.g., intranet and Internet) so that not all user systems 565 are coupled to the host system 902 through the same network.

The data warehouse 500 stores raw data received from various source systems (e.g., source systems 904). The data warehouse 500 may be implemented by a storage device (e.g., using a variety of devices for storing electronic information). Information stored in the data warehouse 500 may be retrieved and manipulated via the host system 902 and/or via one or more user systems 565. In exemplary embodiments, the host system 902 operates as a database server and coordinates access to the data stored on the data warehouse 500.

Source systems 904 refer to sources of data feed, or content, to the host system 902. Source systems 904, for example, may include the switch 501 of FIG. 5. Various types of data, data formats, and time sequences may be utilized by these different source systems, making the collective data received difficult to process and understand. The data standardization processes described herein provide a common data control structure for addressing these difficulties.

The host system 902 depicted in FIG. 9 may be implemented using one or more servers operating in response to a computer program stored in a storage medium accessible by the server. The host system 902 may operate as a network server (e.g., a web server) to communicate with the user terminals 565. The host system 902 handles sending and receiving information to and from the user terminal 565 and can perform associated tasks.

The host system 902 may also operate as an application server. The host system 902 executes one or more computer programs to perform the processing described herein. As shown in the system of FIG. 9, host system 902 is executing a data collector processor (DCP) 503A, an advanced routing and trunking system (ARTS) 555A, and a standardized interpretive engine 910. The DCP 503A, ARTS 555A, and standardized interpretive engine 910 collectively implement the data standardization, transformation, and interpretive engine processes described in FIGS. 10-15.

As indicated above, the data standardization and transformation processes include standardizing source systems' data into a common data structure so that existing deployed code can make use of new source systems by reference through meta-data. The processes utilize a generic, business rules based, component class structure. Component classes extract data from incoming warehouse data feeds into meaningful business information. That information is aggregated, calculated, capacity engineered, monitored, forecasted and alarmed as dictated by business rules. Each component class stands alone from other component classes, which allows differing business rules to be applied to the same raw data without impacting other component class business rules.

Component classes represent both physical elements in the real world and logical elements created for business analysis. Logical elements are comprised of any grouping of physical measures in addition to self-referencing metrics. Logical components are typically comprises of aggregation of subtending measurements to various levels (office, metro, county, state, regional, national, worldwide). Users, user groups, work tasks, and alarm lists may also be logical component classes, all of which may also be aggregated to any defined levels. Physical elements monitored by the system may include network elements (e.g. narrowband, broadband, wireless, packet, etc), CPU processors, and storage units (e.g., disk, tape, memory, array). Physical element measurements may include network transport, time to complete, peg counts, failed/successful completions, session counts, octets transmitted/received, network lag, and protocol overhead. Logical components may include office service types (e.g., analog, digital, ISDN, packet, etc.), various regulatory required reporting aggregates, capacity manager (user) performance, user group performance, service type capacity analysis at various levels and architecture structure of the physical component relations (e.g. tree view).

Optimization classes dictate how component classes interact and how instances within a component class interact. The optimization classes are comprised of business rules for load balancing, provisioning, inventory, and cross monitoring. Sourcing classes control how all external feed systems data is processed and loaded into the warehouse data stores. Utilization of metadata sourcing rules allows addition of new data feeds into the system without undue effort. The sourcing metadata provides the configuration user to build component classes without requiring a prior knowledge of the external feeds-only by reference to the sourcing class instances.

Any number of instances may exists for each class. Multiple classes may be created for monitoring each element type to provide multiple views or reporting needs for each component type. Any number of classes may exist within the system. The implementation of a class serves as the rules, metadata, requirements, and implementation of each measured element type as described further herein.

In exemplary embodiments, the data warehouse 500 and/or the database 567 and 906 may utilize database views. Database views provide security and data isolation by allowing applications to only access data via a database view and preventing the applications from accessing the physical data storage. The use of database views allows for the structure of the database to be altered without having a substantial impact on the applications which access the database. For example, the structure of a database may change over time due to changing business needs and applications that access the database may have to be updated to reflect the change in the database structure. However, the use of database views allows the underlying physical data storage to be modified without requiring adjustment to an application that is accessing the data.

In exemplary embodiments, the host system 902, the data warehouse 500, and/or, the database 906 may utilize both Logical Data Models (LDM) and Physical Data Models (PDM). The LDM is designed to permit users to specify the desired interactions and relations and the PDM reflects the actual storage images of the data. In exemplary embodiments, the user terminals 565 interact only with the LDM on the host system 902. By restricting access to only the LDM, the user terminal applications are unaffected by changes in the PDM. In exemplary embodiments, references to the data warehouse 500, database 567, and/or database 906 are directed to the LDM that is a database view of the actual data storage or PDM.

For example, an incoming data stream corresponding to a particular source may be assigned to a specific section number and is placed into a logical table by the LDM. An intermediate layer, a PDM, may specify a corresponding physical storage location for the incoming data stream. The data is actually stored at the physical storage specified by the PDM, unbeknownst to the LDM. The PDM manages the requests from the LDM to access the data that the LDM believes is stored in the logical table.

The use of the LDM allows a database administrator to make changes to the structure of the underlying database, PDM, without affecting the LDM. For example, the PDM may change over time to reflect changes in telecommunications network that may include the renaming of physical store names, column names, or other parameters. Furthermore, the use of LDM and PDM allows the data to be stored in various physical locations and while allowing the LDM access to the data without regard to the underlying physical storage structure. In exemplary embodiments an existing, or legacy, data warehouse can be used as a PDM, which may require an intermediate layer correlating the LDM to the existing data warehouse to be built.

Figure 10:
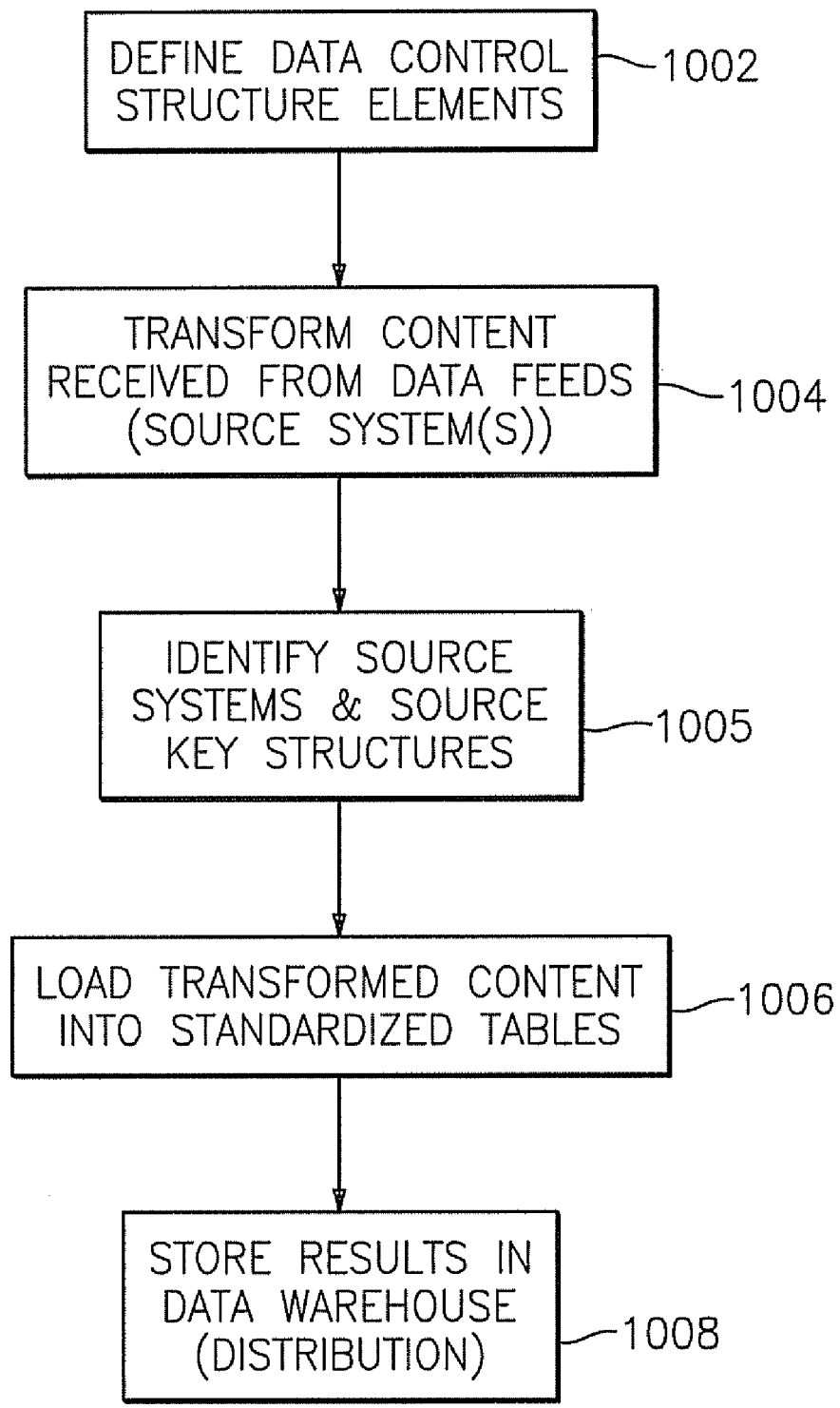
FIG. 10 is a flow diagram describing a process for implementing data standardization activities in accordance with exemplary embodiments.
Figure 11:
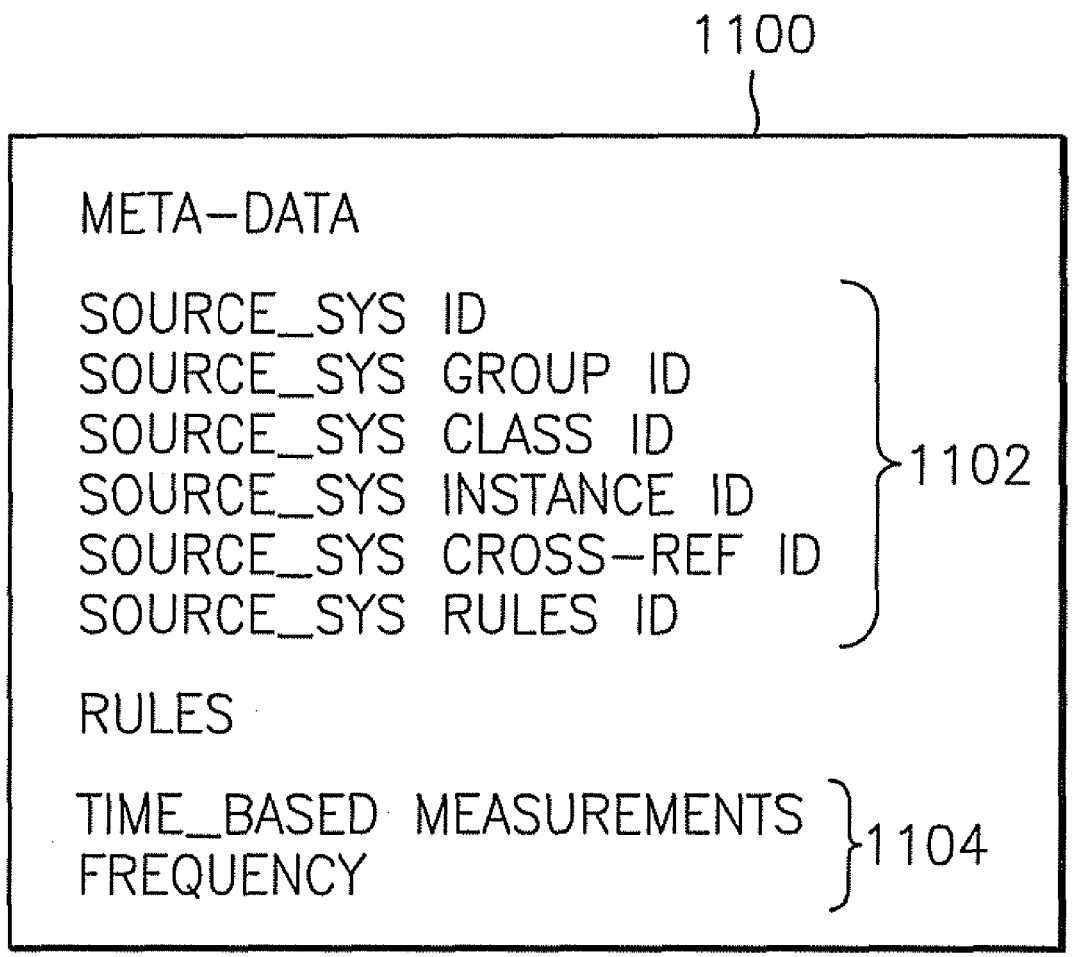
FIG. 11 depicts an exemplary data structure for standardizing source system content in accordance with exemplary embodiments.

Turning now to FIG. 10, a process for implementing the data standardization activities will now be described in exemplary embodiments. At step 1002, a data control structure is defined (e.g., via ARTS 555A) for providing a common data format, a sample of which is shown in FIG. 11. The data control structure 1100 of FIG. 11 enables the standardization of data received from raw data feeds by specifying meta-data elements 1102 for describing the raw data. The meta-data elements 1102 include a unique identifier that identifies the source system (i.e., SOURCE_SYS ID) and defines groups, classes, instances, cross-references and other elements. A class, for example, may be defined by the subject of the measurements provided by the source system, such as a particular trunk. The data control structure 1100 also provides rules 1104 for facilitating the administrative handling of the raw data (e.g., locations in storage where the data will be housed, etc.).

At step 1004, raw data (content) from one or more source systems 904 is transformed by the data collector processor 503A. Incoming data from the feeds are transformed or translated into a standardized warehouse format. No extraction (i.e., selection) of particular data is performed at this stage. All data presented by a feed is processed and prepared. Special cases and data translations may be executed at this stage (e.g., converting time/date stamp formats into the standardized format used by the warehouse database engine deployed). For example, incoming data may be rolled up from sub-directories into a master directory for combining several feed files into a single feed file. Other special handling includes splitting single feed sources into multiple destinations. This may be implemented to handle very large fields or image graphic structures. If a feed is presented in a known standardized format, then this step is skipped.

At step 1005, metadata inventory (i.e., identifier of the data feed or source system), as well as source key structures of the incoming data are determined. Applying the inventory identification to the feed allows data from differing sources to be loaded together by a common loading system. This step also identifies new or changed feeds that have not yet been detected and handled. Newly detected feeds can be assigned identifiers at this step as well. Also, key fields are identified and prepared. While the data set may have the key fields in various locations in the structure, this step allows the keys to be independent of the source or final destination structures for loading purposes. Step 1005 also determines which load table the data will be loaded. Differing load tables may exist to address database engine limitations and provide for concurrent execution of loading multiple fees at the same time.

At step 1006, the content, or resulting load files, are loaded together into common formatted load tables, or standardized tables (i.e., source system tables) defined by the data control structure 1100. This combined load allows a single common process to execute without customization of the data being presented. By utilizing a common and well-groomed process, this ensures that business rules and verification processes for loading data can be consistently and cleanly applied. One example might be a comparison of the number of records presented to the loader versus the number of records actually loaded. Loading occurs to empty tables to allow for the fastest upload time for the database engine. Loading, as described with respect to step 1006, does not place the data into its final destination, it simply gets the data into the warehouse database engine for distribution.

The uploaded data is distributed into the loader table and posts (e.g., insert, update, or replaces) to the final destination data store (e.g., database 906) at step 1008. The data stored in database 906 is now ready for extraction as dictated by business requirements. The extract phase pulls forward the requested data into the primary calculations process, which allows multiple calculations processes to extract the data in multiple ways without regard to what other extract processes are doing. Thus, each extract is independent and has all data available at all times. When a new extract is required by the business of host system 902, it need only be defined, as all data is already loaded and available for the extract process to run. These, and other features, are described further herein.

In exemplary embodiments, the data collector processor 503A automatically reacts to a data event. The data event may include, but is not limited to, the detection of a new raw data feed, a request for a new component class, the absence of a data feed, or the like. The reaction of the data collector processor 503A to the data event can include, adding additional columns to the database 906, updating existing data references, removing columns from the database 906, or the like. In exemplary embodiments, changes made to the database 906 by the data collector processor are applied to the PDM, which may be maintained by the database 906. Additionally, the changes made to the PDM may be propagated to the LDM depending upon the nature of the change to the PDM. In exemplary embodiments, a database administrator may be required to authorized the changes that the data collector processor 503A request be made to the PDM and/or the LDM.

For example, new and missing standardized tables are only created when they are needed. If a system is configured to support a specified number of raw data feeds, but fewer data feeds actually ever appear, then the system will only create table corresponding to the detected data feeds. Additionally, the system will continually add new tables automatically as new data feeds are discovered. In exemplary embodiments, if the meta-data control structure 1100 reflects that a specific number of meta-data elements 1102 are present both the LDM and PDM will reflect that number of elements or columns. Changes made to the meta-data control structure 1100 are automatically propagated to the LDM and/or the PDM.

The content stored as a result of steps 1002-1008 is represented as a common data structure (regardless of the source of the content) that can be processed and manipulated by system users. These system users may each have different business requirements and, as a result, need different views or perspectives of the information. For example, a marketing or sales representative of a business entity may be interested in cost/benefits of provisioning a selected system, while a safety officer of the same business entity may want to focus on physical or human risk factors. The ARTS 555A provides the ability to transform the data stored in database 906 in accordance with the business need.

Figure 12:
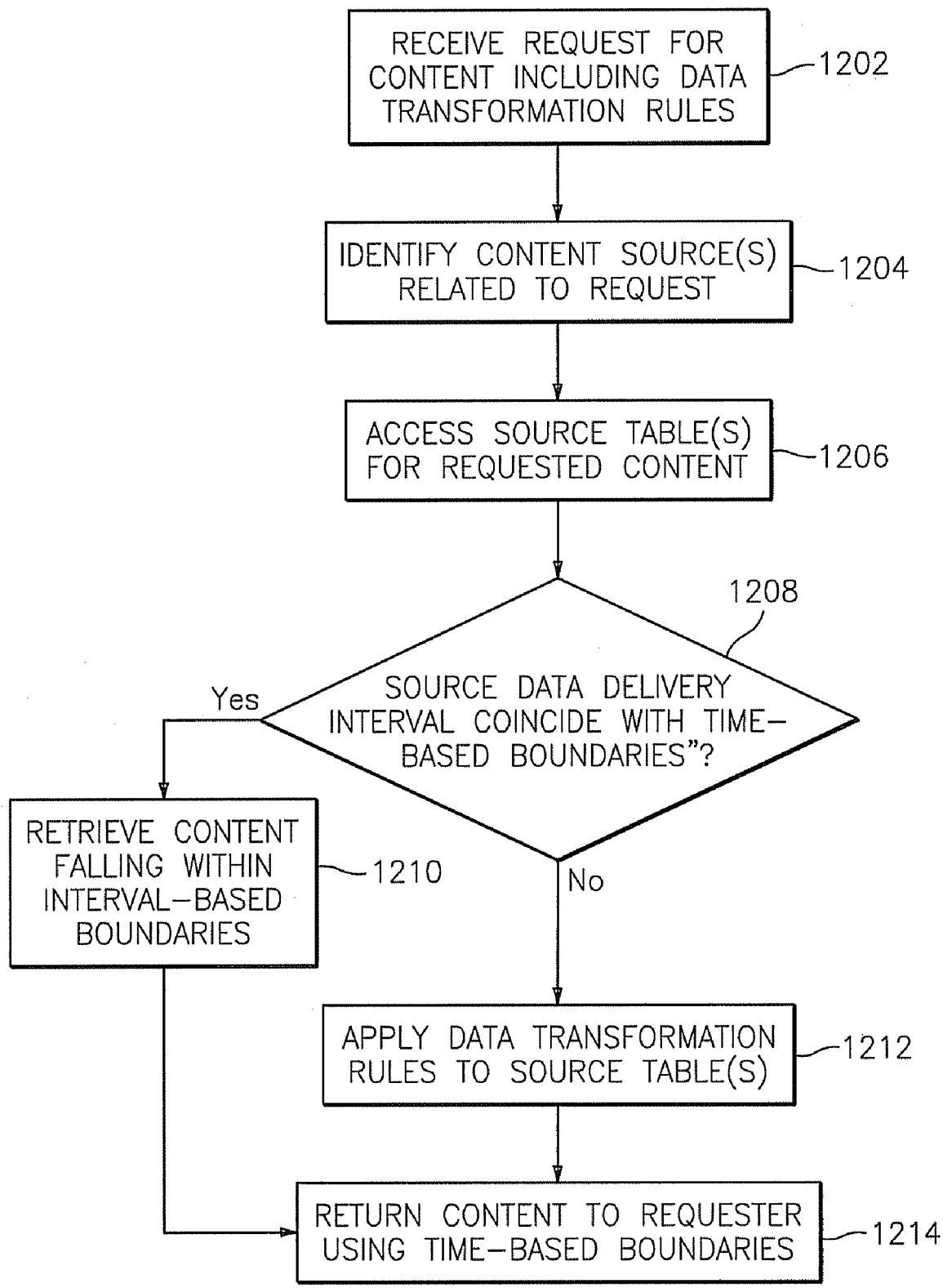
FIG. 12 is a flow diagram describing a process for implementing data transformation rules to selected content in accordance with exemplary embodiments.

Turning now to FIG. 12, a process for implementing data transformation rules to selected content will now be described in accordance with exemplary embodiments. At step 1202, a request for content is received at the host system 902. The request may come from user terminal 565 and include data transformation rules that specify the type and form of information that is desired. For example, the request may be for data relating to bandwidth usage for a selected geographic area. The request may also specify the time frame, interval, etc. of the usage information.

Figure 13:
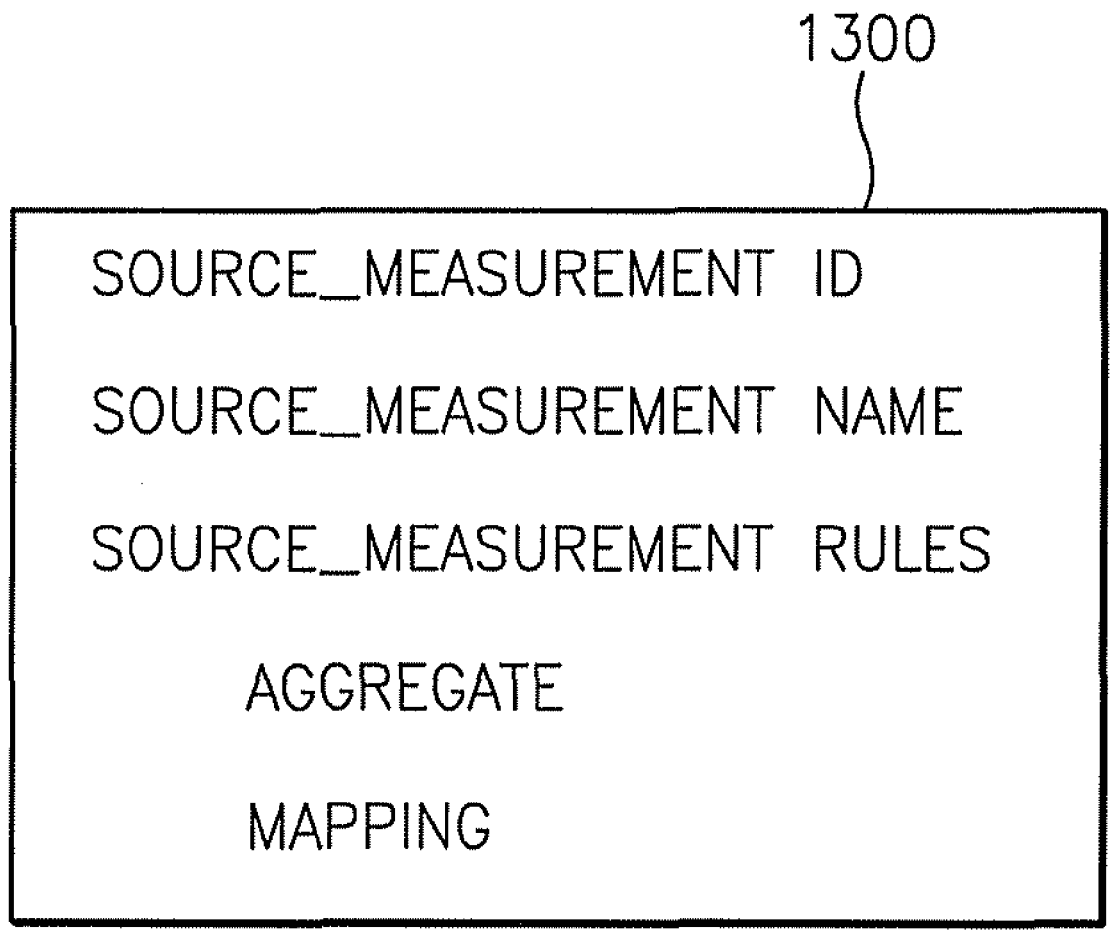
FIG. 13 depicts an exemplary data structure for use in implementing data transformation processes in accordance with exemplary embodiments.

At step 1204, the ARTS 555A identifies which source system(s) 904 provide the type of data that the requester is looking for. At step 1206, the source table(s) stored in database 906 which correspond to the source systems identified in step 1204 are accessed for the requested content. The data retrieved from the database 906 may not coincide with the data requested if the interval or frequency specified in the request differs from the interval of frequency of the data as it is stored in the database 906. For example, suppose that the data feed from a source system provides metrics in hourly intervals and the data requested from the requester is specified in daily intervals. The ARTS 555A enables the normalization of this time-based data so that it can be transformed to a time measure that is specified by a requester. Accordingly, at step 1208, the ARTS 555A determines whether the two intervals coincide with one another. If so, the content is retrieved in accordance with the time measure requested at step 1210. Otherwise, the ARTS 555A applies the data transformation rules specified in the request to the source tables that store the requested data at step 1212. This may be performed using a data control structure as shown in FIG. 13. In either event, the requested content is returned to the requester at step 1214.

As shown in the data control structure 1300 of FIG. 13, rules may be applied to content stored in database 906 such that specific searches of the content may be performed as dictated by the needs of a user. Suppose that the data collected from one of the source systems 904 is bandwidth usage data. Suppose also that the period of measure specified for storing the data (by virtue of the data control structure) is fifteen minute intervals, or 0.25 hours with 96 periods in a day. The user may wish to receive daily usage measurements that are broken down into 30-minute intervals. This conversion, or transformation, may be implemented using the data control structure 1300 of FIG. 13.

A variety of presentation capabilities is facilitated through the data control structure 1300. For example, the transformation rules may enable a user to specify a sum of measurements, a percentage of measurements, measurement averages/means, measurements taken over a selected time frame, etc. Time-based measurements, or sequences of measurements, may be further specified based upon, e.g., time of day, day of week, etc., peak measurements for any of the aforementioned periods, busy periods of the day, week, or other parameters. In addition, past measurements taken may be searched via these transformation rules (e.g., previous 96 periods).

The processes and data structures described above in FIGS. 9-13 may be implemented via an independent language referred to herein as "Common Enterprise Engineering Language." The Common Enterprise Engineering Language is designed to interoperate between the meta-data and warehouse database 500. This language converts business rules or requirements provided by users of the system into operational code by utilizing the meta-data. The language is easily modified by changing the meta-data elements so that the underlying code does not require updates whenever business needs change. The language then interprets the business rules accordingly. The Common Enterprise Engineering Language is implemented via the standardized interpretive engine 910 as described herein.

The Common Enterprise Engineering Language utilizes the standardized data control structures (e.g., data control structures 1100 and 1300), data set, and functional infrastructure described above for defining the business and user requirements of a data warehouse (e.g., data warehouse 500) that provides a means for accomplishing the business and user needs within the functional requirements. A warehouse component, may be, e.g., a user, user type, physical component, aggregated calculations component, piece of equipment, message type, etc. Regardless of the item being monitored or the purpose of the component class (component rules), all components are treated equally and have all functional requirements available to interpret the business and user requirements.

The formalized structure of the requirements is utilized "as is" for the design and operations of the warehouse. In other words, the defined requirements are the design and the meta-data that produce the actual running code (via a translation interface). There is no requirement of developer interaction between the business and user requirements and the final product—the user defined business and user requirements are automatically converted into the executing code of the warehouse via the functional requirements. The functional requirements are adjusted to provide the means of fulfilling the business and user requirements as indirect requirements not directly addressing the specifics of those business and user requirements.

Figure 14:
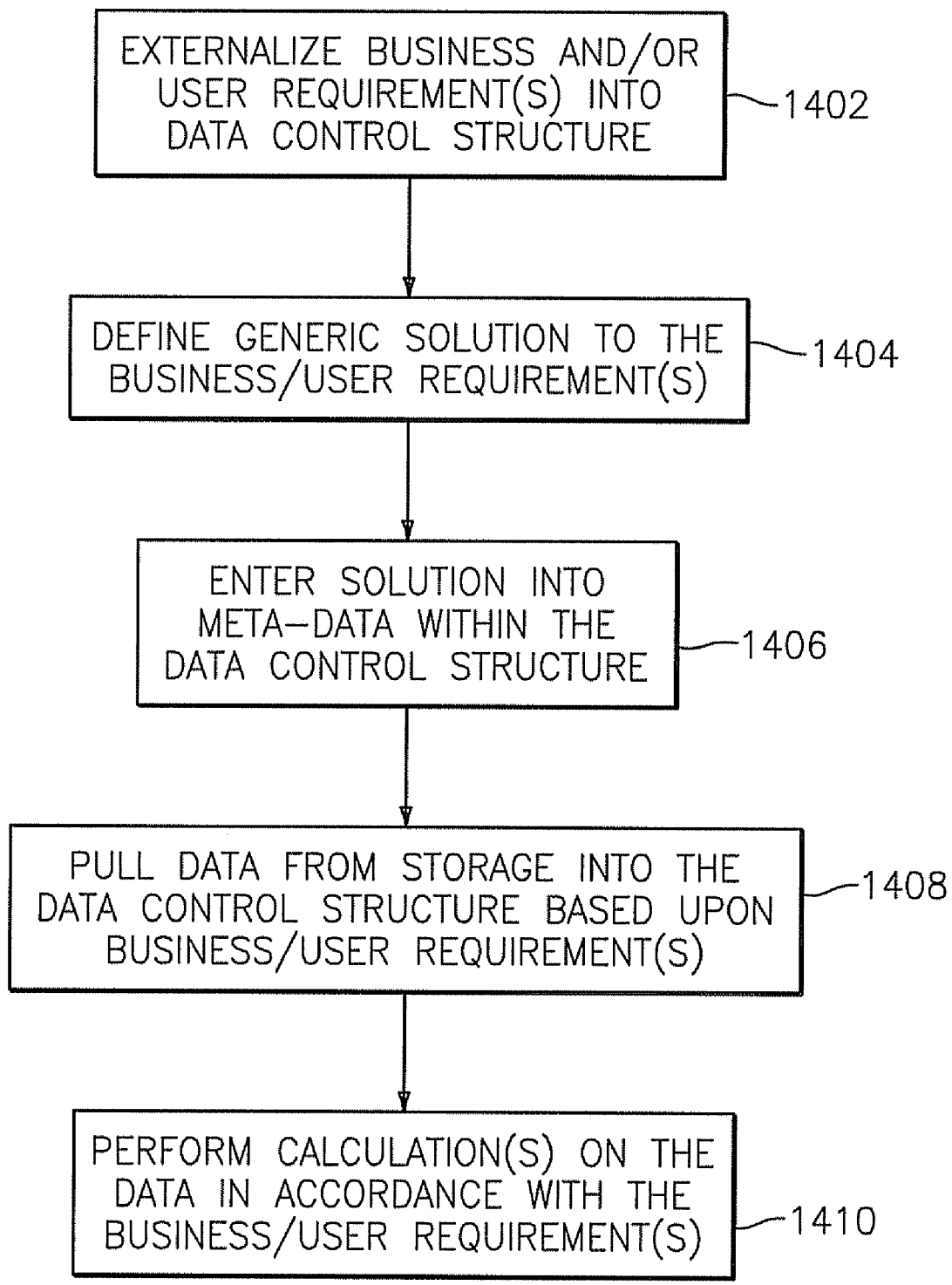
FIG. 14 is a flow diagram describing a process for implementing a standardized interpretive engine in accordance with exemplary embodiments.

A process for implementing the features of the standardized interpretive engine 910 will now be described in FIG. 14 in accordance with exemplary embodiments. Business and user requirements are externalized into a component class of a common structure (e.g., data control structures 1100 and/or 1300) at step 1402, which is used by the functional requirements to produce a desired result. Business requirements refer to capabilities needed or desired by a business enterprise in furtherance of business operations. User requirements refer to capabilities needed or desired by an individual within the business based upon the individual's role in enterprise. The requirements are placed into the structure(s), which allows them to be interpreted by the system to directly result in the final code that executes and thus eliminates the "hard coding" of the business and user requirements at the functional requirements level. For example, consider a business requirement: usage based components need to be engineered to handle peak usage. Consider also a user requirement: display needed information to engineer for peak usage. A corresponding language requirement might be: ABS=average of total usage from top 3 months of total usage over last 12 months. A functional requirement might look like: support calculation of aggregates based on any selected measure; support specification of number of months rolling and top number of months. The language eliminates the business and user requirements and instead turns them into configurable items. This also eliminates the need of coding the business and user requirements into the final product. Instead of creating requirements for the specific component, requirements are made in a general sense to allow the business/user to specify their needs. At step 1404, a solution to the business and user requirements is defined and entered into metadata within the component class of the data control structure(s) 1100 and/or 1300 at step 1406. The functional requirement is established to support the calculation request, not the specifics of the calculation. Utilizing this language, all business and user requirements are externalized, or input into the system as rules, which leaves the functional requirements to be generic and applicable to all components as needed.

Required data is pulled from the warehouse 500 at step 1408, and calculations, aggregations, and/or storage activities are performed on the data based upon the business and/or user requirements at step 1410. The data is pulled forward to the component class, rather than pushed upward into the warehouse calculations. In this manner, a single data source can be used as often as desired for as many classes as desired. All warehouse measurements may be available for any and all classes defined by the system. Consider the following example:

Class 1 uses 5ESS Analog measurements
    Class 1 uses 5ESS Digital measurements
    Class 1 uses 5ESS ISDN measurements
    Class 2 uses DMS100 Analog measurements
    Class 2 uses 5ESS Analog measurements
    Class 2 uses EWSD Analog measurements Note in the above example that Class 1 and Class 2 both make use of 5ESS Analog measurements. By having the business rules pull the requested or required data forward to themselves, the data is available for all cases. This allows any data source to be available to any and all classes. As a new data source is made available, the existing classes can be adjusted to pull any useful new data. The source data is not aware of where it is being pulled as the data sources are independent of the classes that use them. No special code or process is created to push the data where it is needed, as each class may independently determine the data desired and pull from the warehouse measures as needed.

User defined business rules define the data to be pulled into the class. If the data source contains further sub-entries or subtending data, the subtending data is automatically aggregated as specified to the level requested by the business rules. For example, consider the available dataset: Measurements at the line level (5ESS section 90, where section 90 identifies the data feed source). The data structure or keys for the measurements are comprised of OFFICE, SM, LU, GROUP, LINE (5 levels). Assume that Class 1 is created to engineer at the LU level. Assume also that Class 1 pulls measurements from section 90 grouped by OFFICE, SM, LU. Further assume that Class 1 also pulls measurements from section 90 grouped by OFFICE, SM, (to determine how much load is on the hosting component for each LU). Data is derived, or aggregated, from the LINE measurements. The user does not need to know or acknowledge that the data is actually coming in at a more granular level than is being requested. The same data set may be used by components that are designed for differing levels. One class may operate and engineer at the LINE level, another at the LU level, and another at the OFFICE level. Each class is independent of the other, has different business rules and different uses, yet all can pull from the same data set.

Figure 15:
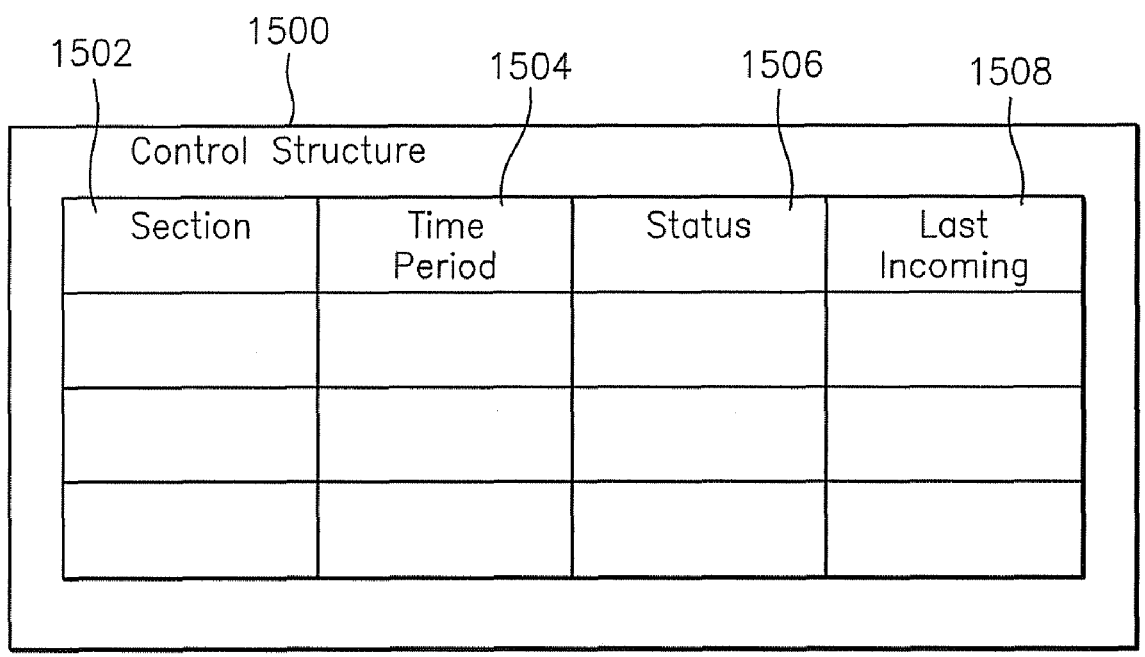
FIG. 15 depicts an exemplary processing control structure in accordance with exemplary embodiments.

In exemplary embodiments, the data warehouse 500 receives consistent and reliable data feeds (e.g. on time every time) and the host system 902 executes programs on a strict schedule. In other exemplary embodiments, the data warehouse 500 does not receive consistent and reliable data feeds (e.g., data can be late or missing) and the host system 902 must employ a more intelligently designed control structure to accommodate the unpredictable data feeds. FIG. 15 illustrates an exemplary embodiment of a processing control structure 1500. The control structure 1500 includes a section field 1502, a time period field 1504, a status field 1506, and a last incoming field 1508. The last incoming field 1508 includes the last time that data was received from a data feed. The section field 1502 includes the section number corresponding to the source of the received data. The time period field 1504 includes the date and time of the traffic that the data represents. The status field 1506 reflects the processing status of the data received from the data feed and may include, but is not limited to, In (e.g., still receiving data), Prep (e.g., processing is being preformed on the data), Done (e.g., processing has been completed on the data), Clean (e.g., sufficient time has passed since processing has been completed and no further data has been received), and Del (e.g., delete stored data). Additionally, the control structure 1500 includes a process state field 1508 that can be used to track the state of each raw data feed. In the event that processing of the data is interrupted or prematurely stopped, the state variable can be used to determine where to resume processing of the data.

In exemplary embodiments, processing of the data does not begin until the data received has remained unchanged for a first time period (e.g., no new data or updated data for a given data feed have been received). The first time period can be any amount of time sufficient to ensure that the majority of data has been received and no additional data is expected. In the event that additional data is received during processing the processing can be stopped and the time reset for the time period before processing resumes. Once processing of the data has been completed, the data is stored for a second time period before it is deleted from the system. The second time period may be any amount of time sufficient to ensure that data will not be deleted before it is required. In one embodiment, the first period is approximately two hours and the second time period is approximately sixty-days.

For example, the host system 902 receives an incoming data feed for a particular section at a time T. The host system 902 then receives another incoming data feed for the same section ten minutes later. After not receiving any new data for the section for two hours, the host system 902 determines that the data received for the section is stable and begins to process the received data. After processing of the data begins, the host system 902 may receive additional data feed for the section, at which point processing is stopped and the host system again waits until the data is determined to be stable. Once the host system 902 completes processing of the data, the host system continues to store the raw data feeds for seven days to ensure that the all of the data for the section was received. After seven days of no activity (e.g., incoming data feeds or data processing) for a given section, the raw data for that section is deleted and only the processed data is stored. The processed data is stored for a period of sixty days before it is deleted or moved to a data warehouse.

As described above, the present invention can be embodied in the form of computer-implemented processes and apparatuses for practicing those processes. The present invention can also be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the claims. Moreover, the use of the terms first, second, etc., do not denote any order or importance, but rather the terms first, second, etc., are used to distinguish one element from another. Furthermore, the use of the terms a, an, etc., do not denote a limitation of quantity, but rather denote the presence of at least one of the referenced items.

What is claimed is:

1. A method for implementing standardized enterprise warehouse system processes, comprising:
   extracting content from one or more source systems that provide a feed for the content;
   loading extracted content into one or more standardized data layout tables of a data control structure based upon meta-data and rules that define the data control structure, wherein the extracted content is in condition for transformation and data warehouse loading, and the standardized data layout tables comprise a logical data model;
   propagating the extracted content into a physical data model, and
   updating the physical data model upon the detection of a data event.

2. The method of claim 1, wherein the meta-data defined in the data control structure includes at least one of:
   a source system identifier;
   a source system group identifier;
   a source system class identifier;
   a source system instance identifier; and
   a source system cross-reference identifier.

3. The method of claim 1, wherein the meta-data defined in the data control structure includes a source system rules identifier that specifies a location of a table that contains rules associated with the data control structure.

4. The method of claim 1, wherein the rules specify management and administrative instructions for handling the meta-data.

5. The method of claim 1, wherein the content includes raw data.

6. The method of claim 1, wherein the content extracted from one or more source systems include disparate data formats.

7. The method of claim 1, wherein the data event includes the detection of a new data feed.

8. A system for implementing standardized enterprise warehouse system processes, comprising:
   a processor in communication with one or more source systems via a communications link, the one or more source systems providing a feed for content; and
   a data standardization application executing on the processor, the data standardization application implementing:
      extracting the content from the one or more source systems;
      loading extracted content into one or more standardized data layout tables of a data control structure based upon meta-data and rules that define the data control structure, wherein the extracted content is in condition for transformation and data warehouse loading, and the standardized data layout tables comprise a logical data model;
      propagating the extracted content into a physical data model, and
      updating the physical data model upon the detection of a data event.

9. The system of claim 8, wherein the meta-data defined in the data control structure includes at least one of:
   a source system identifier;
   a source system group identifier;
   a source system class identifier;
   a source system instance identifier; and
   a source system cross-reference identifier.

10. The system of claim 8, wherein the meta-data defined in the data control structure includes a source system rules identifier that specifies a location of a table that contains rules associated with the data control structure.

11. The system of claim 8, wherein the rules specify management and administrative instructions for handling the meta-data.

12. The system of claim 8, wherein the content includes raw data.

13. The system of claim 8, wherein the content extracted from one or more source systems include disparate data formats.

14. The system of claim 8, wherein the data event includes the detection of a new data feed.

15. A computer program product for implementing standardized enterprise warehouse system processes, the computer program product including instructions for implementing a method, comprising:
   extracting content from one or more source systems that provide a feed for the content; and
   loading extracted content into one or more standardized data layout tables of a data control structure based upon meta-data and rules that define the data control structure, wherein the extracted content is in condition for transformation and data warehouse loading, and the standardized data layout tables comprise a logical data model;
   propagating the extracted content into a physical data model, and
   updating the physical data model upon the detection of a data event.

16. The computer program product of claim 15, wherein the meta-data defined in the data control structure includes at least one of:
   a source system identifier;
   a source system group identifier;
   a source system class identifier;
   a source system instance identifier; and
   a source system cross-reference identifier.

17. The computer program product of claim 15, wherein the meta-data defined in the data control structure includes a source system rules identifier that specifies a location of a table that contains rules associated with the data control structure.

18. The computer program product of claim 15, wherein the rules specify management and administrative instructions for handling the meta-data.

19. The computer program product of claim 15, wherein the content extracted from one or more source systems include disparate data formats.

20. The computer program product of claim 15, wherein the data event includes the detection of a new data feed.

* * * * *